(12) United States Patent
Licausi et al.

(10) Patent No.: US 12,685,032 B1
(45) Date of Patent: Jul. 14, 2026

(54) METHOD OF MAKING A SUPERCONDUCTING NANOWIRE SINGLE PHOTON DETECTOR USING A SIDEWALL IMAGE TRANSFER PROCESS

(71) Applicant: PSIQUANTUM CORP., Palo Alto, CA (US)

(72) Inventors: Nicholas Licausi, Watervliet, NY (US); Vimal Kamineni, Fremont, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 944 days.

(21) Appl. No.: 18/046,668

(22) Filed: Oct. 14, 2022

Related U.S. Application Data

(60) Provisional application No. 63/270,263, filed on Oct. 21, 2021.

(51) Int. Cl.
H10N 60/01 (2023.01)
H10N 60/85 (2023.01)

(52) U.S. Cl.
CPC ....... H10N 60/0688 (2023.02); H10N 60/851 (2023.02)

(58) Field of Classification Search
CPC .......................... H10N 60/0688; H10N 60/851
See application file for complete search history.

(56) References Cited

U.S. PATENT DOCUMENTS 5,418,213 A * 5/1995 Tanaka ............... H10N 60/0688
505/410
2020/0328339 A1* 10/2020 Shabani ............. H10N 60/0912
2020/0333179 A1 10/2020 Chung et al.

* cited by examiner

*Primary Examiner* — Paul A Wartalowicz
(74) *Attorney, Agent, or Firm* — THE MARBURY LAW GROUP PLLC

(57) ABSTRACT

An embodiment method of manufacturing a superconducting nanowire includes forming a multilayer thin film stack including a superconducting layer, forming a mandrel over the multilayer thin film stack, forming an etch mask including a first mask portion on a first side of the mandrel and a second mask portion on a second side of the mandrel, removing the mandrel, and etching the multilayer thin film stack using the etch mask to thereby form a superconducting nanowire.

20 Claims, 23 Drawing Sheets

METHOD OF MAKING A SUPERCONDUCTING NANOWIRE SINGLE PHOTON DETECTOR USING A SIDEWALL IMAGE TRANSFER PROCESS

FIELD

This disclosure relates generally to photonic devices and, more specifically, to a superconducting nanowire single photon detector and method of fabrication thereof.

BACKGROUND

A superconducting nanowire single photon detector (SNSPD) may have a high sensitivity to single photon events. During operation, a nanowire in the SNSPD may be cooled to, for example, 2.5 K, which is well below its superconducting critical temperature. Upon absorption of a photon in the nanowire, superconductivity is locally broken, and a change in current is detected as a voltage pulse by associated amplification electronics. In many configurations, the SNSPD's critical temperature depends on the quality of a thin film of material forming the nanowire, with lower quality films exhibiting lower critical temperatures. Therefore, significant research efforts have been devoted to improving the design and quality of thin films for SNSPDs in order to achieve higher operation temperatures.

SUMMARY

An embodiment method of manufacturing a superconducting nanowire includes forming a multilayer thin film stack including a superconducting layer, forming a mandrel over the multilayer thin film stack, forming an etch mask including a first mask portion on a first side of the mandrel and a second mask portion on a second side of the mandrel, removing the mandrel, and etching the multilayer thin film stack using the etch mask to thereby form one or more superconducting nanowires.

BRIEF DESCRIPTION OF THE DRAWINGS

The accompanying drawings, which are incorporated herein and constitute part of this specification, illustrate example embodiments of the disclosure, and together with the general description given above and the detailed description given below, serve to explain the features of the disclosure.

DETAILED DESCRIPTION

The various embodiments are described in detail with reference to the accompanying drawings. The drawings are not necessarily to scale and are intended to illustrate various features of the disclosure. Wherever possible, the same reference numbers will be used throughout the drawings to refer to the same or like parts. References made to particular examples and implementations are for illustrative purposes and are not intended to limit the scope of the disclosure or the claims.

It will also be understood that, although the terms first, second, etc., are, in some instances, used herein to describe various elements, these elements should not be limited by these terms. These terms are used only to distinguish one element from another. For example, a first dielectric layer could be termed a second dielectric layer, and, similarly, a second dielectric layer could be termed a first dielectric layer, without departing from the scope of the various described embodiments. The first dielectric layer and the second dielectric layer are both dielectric layers, but they are not the same dielectric layer.

Disclosed embodiments relate to photonic devices and, more specifically, to a superconducting nanowire single photon detector and method of fabrication thereof.

Figure 1A:
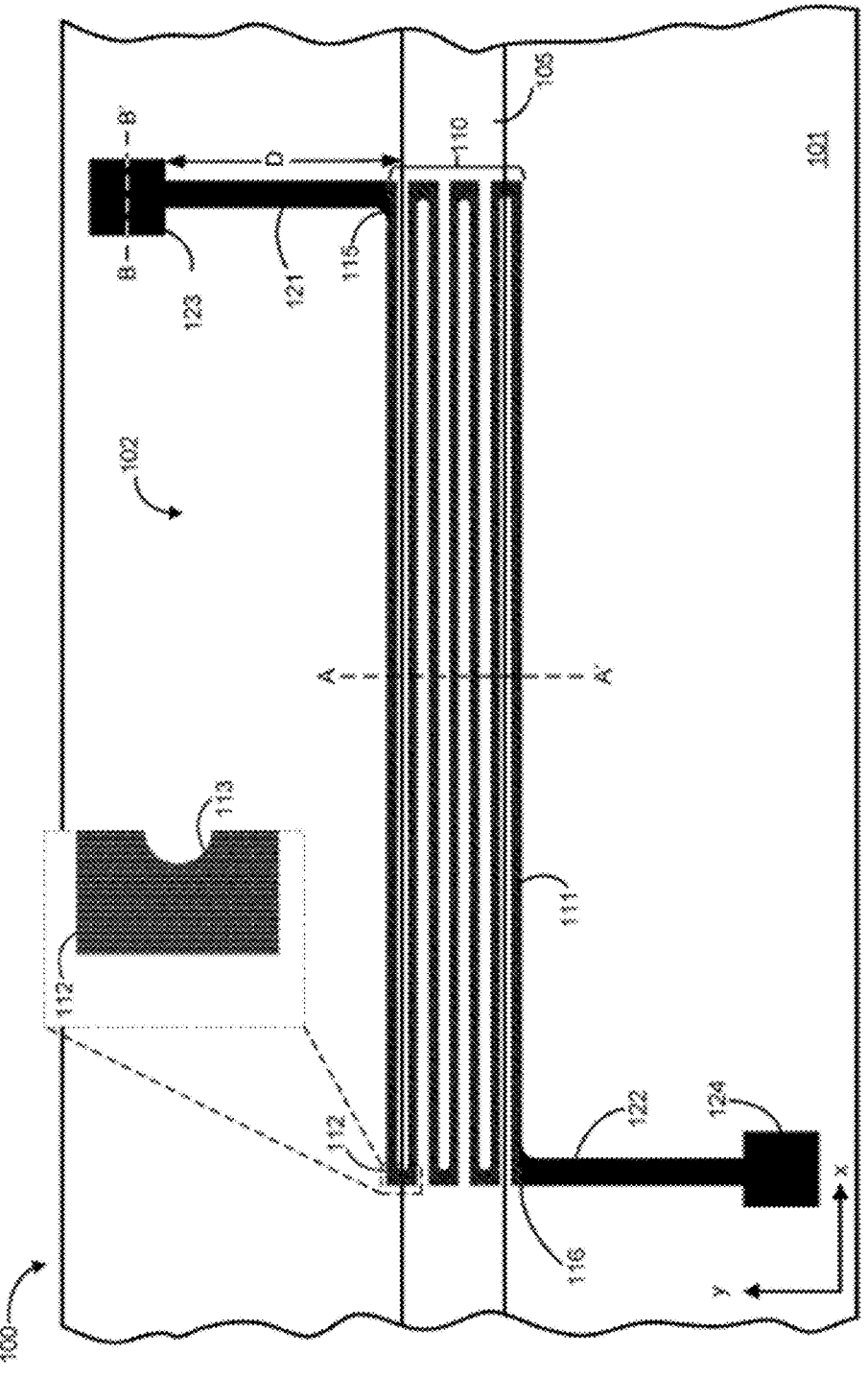
FIG. 1A illustrates a plan view of a superconducting nanowire single photon detector, in accordance with various embodiments.

FIG. 1A is a plan view of an SNSPD 100 in an x-y plane according to some embodiments. As shown, the SNSPD 100 includes a superconductor stack 102 including a nanowire portion 110, connector portions (121, 122) and contact portions (123, 124). The nanowire portion 110 includes parallel line segments 111 and joining segments 112 together forming a meandering superconducting nanowire. In some embodiments, as shown in the inset in FIG. 1A, which provides a zoomed-in view of one of the joining segments 112, the joining segment 112 may have a curved inner perimeter 113 between two neighboring parallel line segments 111 joined by the joining segment 112. In some embodiments, the curved inner perimeter provides a smooth transition between the two neighboring line segments to minimize current crowding effects. In some embodiments, nanowire portion 110 may be fabricated over an optical waveguide structure (or waveguide) 105 to improve optical coupling efficiency. In some embodiments, as shown in FIG. 1A, the nanowire portion 110 may be wider than the waveguide 105 to further improve optical coupling efficiency.

As an example, FIG. 1A shows an area occupied by nanowire portion 110 being somewhat rectangular in shape. In practice, the nanowire portion may have any of a variety of geometrical configurations. For example, the nanowire may form one or more U-shapes, as shown in FIG. 1F. In some embodiments, the nanowire portion 110 may have a geometry that may be independent of that of the waveguide 105. Most generally, one or more embodiment disclosed herein may have any geometry without departing from the scope of the present disclosure.

As shown in FIG. 1A, the contact portion 123 may be connected to a first end 115 of nanowire portion 110 via a connector portion 121, and the contact portion 124 may be connected to a second end 116 of the nanowire portion 110 via a connector portion 122. In some embodiments, the SNSPD 100 may further include metal contacts (not shown in FIG. 1A) over contact portions (123, 124). To prevent or reduce optical coupling (e.g., evanescent coupling) between the metal contacts and the waveguide 105, the contact portions (123, 124) may be disposed (e.g., spaced apart) at a distance D (e.g., a lateral distance measured in the x-y plane) from the waveguide 105. The distance D may be dependent on a wavelength of photons to be transferred via the waveguide 105. In some embodiments, the distance D may be at least 500 nm (e.g., 800 nm). The superconductor stack 102 and the waveguide 105 may be disposed on a substrate 101.

Figure 1B:
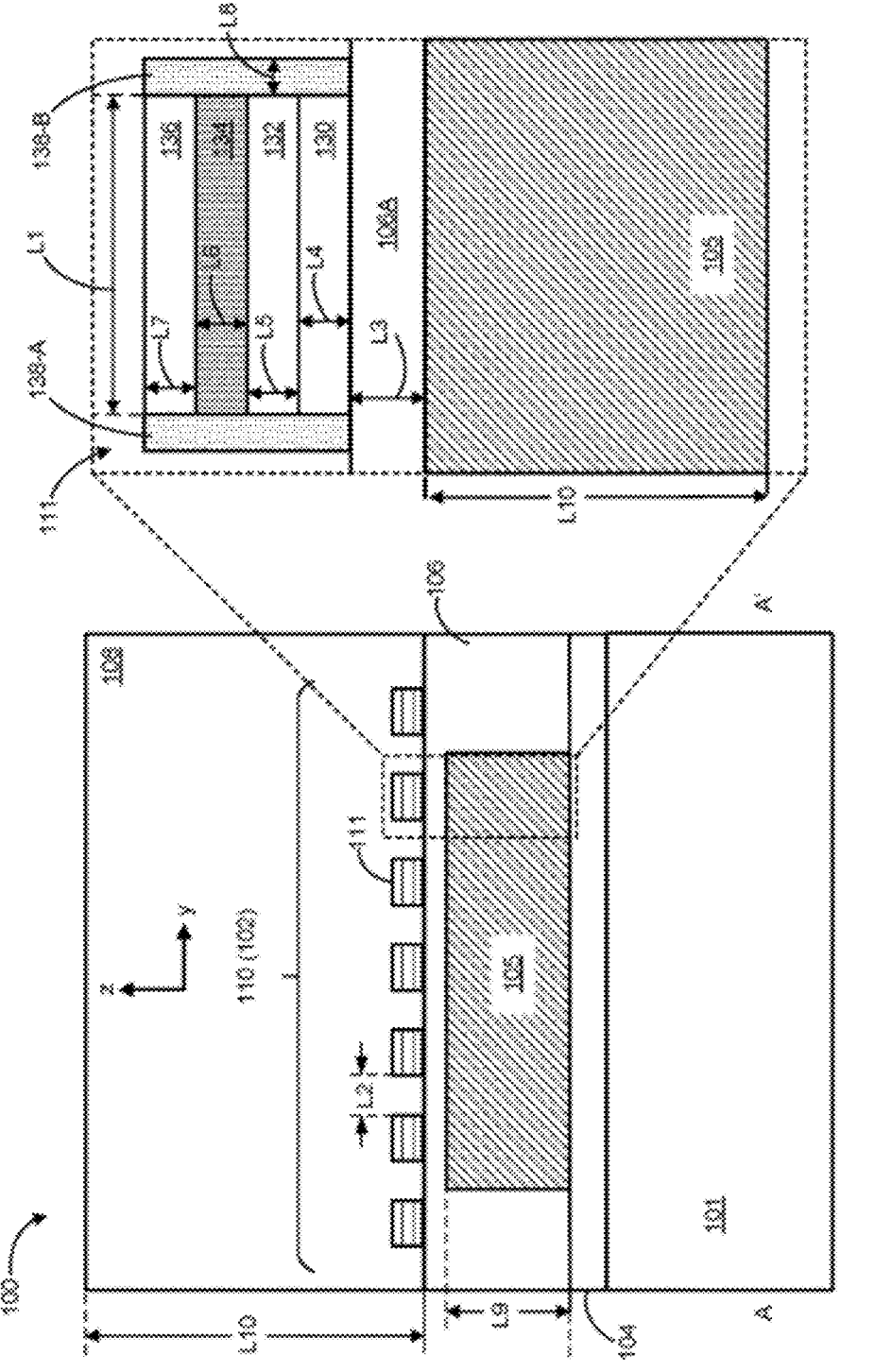
FIG. 1B is a vertical cross-sectional view along line A-A' across a nanowire portion of the superconducting nanowire single photon detector shown in FIG. 1A, in accordance with various embodiments.

FIG. 1B is a cross-sectional view of the SNSPD 100 in an y-z plane cut across parallel line segments 111 of the nanowire portion 110 (along line A-A' in FIG. 1A), according to some embodiments. As shown, the SNSPD 100 may have a layered structure, including a first dielectric layer 104 over a substrate 101, the waveguide 105 over the first dielectric layer 104, a second dielectric layer 106 over and around the waveguide 105 and serving as cladding for waveguide 105, a superconductor stack 102 over the second dielectric layer 106, a third dielectric layer 108 that encapsulates the superconductor stack 102, and additional layers and structures not shown in FIG. 1B. In other words, the first dielectric layer 104 may be located between the substrate 101 and the waveguide 105, the waveguide 105 may be located between the first dielectric layer 104 and a first portion of the second dielectric layer 106, a second portion of the second dielectric layer 106 may be located around the waveguide 105 and over the first dielectric layer 104, and the superconductor stack 102 may be located between the second dielectric layer 106 and a portion of third dielectric layer 108. In some embodiments, the first dielectric layer 104 functions as a buffer layer between the substrate 101 and the waveguide 105 and has a thickness of at least 20 nm.

FIG. 1B also includes an inset showing a zoomed-in view of the cross-section of one of the parallel line segments 111 and a corresponding portion of the waveguide 105, according to some embodiments. As shown, each of the parallel line segments 111 includes a barrier layer 130, a seed layer 132 over the barrier layer 130, a superconductor layer 134 over the seed layer 132, and a silicon cap layer (or cap layer) 136 over the superconductor layer 134. In other words, the seed layer 132 may be located between the barrier layer 130 and the superconductor layer 134, and the superconductor layer 134 may be located between the seed layer 132 and the cap layer 136). The SNSPD 100 may further include sidewalls 138-A and 138-B flanking opposing sides of the superconductor stack 102. In some embodiments, the barrier layer 130 may include silicon and nitrogen (e.g., silicon nitride), the seed layer 132 may include aluminum and nitrogen (e.g., aluminum nitride), the superconductor layer 134 may include niobium and one or more of nitrogen, titanium, aluminum, germanium, and tin (e.g., NbN, NbTi, NbAl, NbGe, NbSn, etc.), the cap layer 136 may include silicon (e.g., amorphous silicon or a-Si, polysilicon or poly-Si, or single-crystal silicon or mono c-Si), and sidewalls 138-A and 138-B include silicon and nitrogen (e.g., silicon nitride).

As shown in FIG. 1B, a portion 106A of the second dielectric layer 106 may be located between the waveguide 105 and the barrier layer 130. Also, a portion of the third dielectric layer 108 may be located over the cap layer 136, and a portion of first dielectric layer 104 may be located between the waveguide 105 and the substrate 101. FIGS. 1A and 1B illustrate some vertical and horizontal dimensions of the SNSPD 100, as listed below:

L1: width of superconductor layer 134 in each parallel line segment 111 of nanowire portion 110;

L2: width of space between two neighboring line segments 111 of nanowire portion 110;

L3: thickness of the portion 106A of second dielectric layer 106;

L4: thickness of barrier layer 130;

L5: thickness of seed layer 132;

L6: thickness of superconductor layer 134;

L7: thickness of cap layer 136;

L8: thickness of sidewalls 138-A and 138-B;

L9: thickness of waveguide 105;

L10: thickness of third dielectric layer 108;

In some embodiments:

L1 may be greater than 20 nanometers (nm) and less than 200 nm (i.e., 20 nm<L1<200 nm);

L2 may be greater than 20 nm and less than 300 nm (i.e., 30 nm<L2<300 nm);

L3 may be greater than 10 nm and less than 100 nm (i.e., 10 nm<L3<100 nm);

L4, L5, L6 and L7 may be each greater than 2 nm and less than 40 nm (i.e., 2 nm<L4, L5, L6, L7<40 nm);

L8 may be greater than 1 nm and less than 20 nm (i.e., 1<L8<20 nm);

L9 may be greater than 100 nm and less than 1 micrometer (μm) (i.e., 100 nm<L9<1 μm);

L10 may be greater than 800 nm and less than 100 μm (e.g., 800 nm<L10<20 μm).

In some embodiments:

L1 may be greater than 45 nm and less than 100 nm (i.e., 45 nm<L1<100 nm);

L2 may be greater than 45 nm and less than 200 nm (i.e., 45 nm<L2<200 nm);

L3 may be greater than 20 nm and less than 50 nm (i.e., 20 nm<L3<50 nm);

L4 may be greater than 5 nm and less than 20 nm (i.e., 5 nm<L4<20 nm);

L5 and L6 may be each greater than 5 nm and less than 20 nm (i.e., 5 nm<L5, L6<20 nm);

L7 may be greater than 3 nm and less than 20 nm (i.e., 3 nm<L7<20 nm);

L8 may be greater than 2 nm and less than 10 nm (i.e., 2<L8<10 nm);

L9 may be greater than 150 nm and less than 500 nm (i.e., 150 nm<L9<500 nm);

L10 may be greater than 1 μm and less than 10 μm (i.e., 1 μm<L10<10 μm); and

In some embodiments, the width L1 and thickness L6 of the superconductor layer 134 may be selected based on a wavelength of the photons to be detected. In some embodiments, L10 may be designed to be sufficiently large to prevent any optic coupling (e.g., evanescent coupling) between metal lines (not shown) formed over the third dielectric layer 108 and the waveguide 105 or superconductor stack 102. In some embodiments, the sum of L3, L4, and L5 may be small enough to enable optical coupling (e.g., evanescent coupling) between superconductor layer 134 and the waveguide 105 (e.g., L3+L4+L5<200 nm).

Figure 1C:
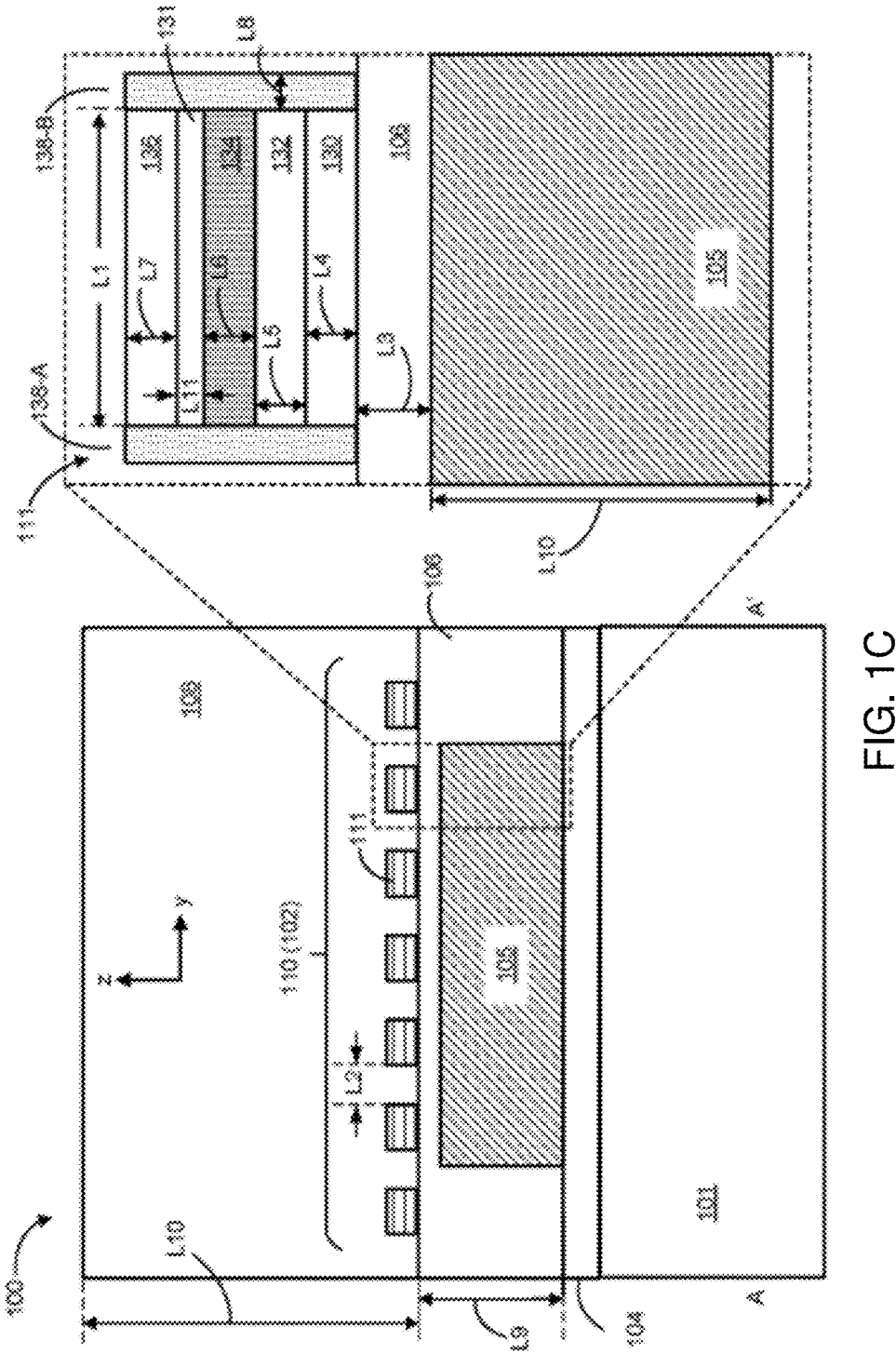
FIG. 1C illustrates a vertical cross-sectional view of a superconducting nanowire single photon detector that includes a protective layer, in accordance with various embodiments.

FIG. 1C is similar to FIG. 1B except that the inset in FIG. 1C shows the superconductor stack 102 further including an optional protective layer 131 between the superconductor layer 134 and the cap layer 136, according to some embodiments. In some embodiments, the optional protective layer 131 includes aluminum and nitrogen (e.g., aluminum nitride). In some embodiments, the protective layer has a thickness L11 greater than 5 nm and less than 10 nm (e.g., 5 nm<L11<10 nm). In some embodiments, L11 greater than 1 nm and less than 5 nm (e.g., 1 nm<L11<5 nm). In some embodiments, the optional protective layer 131 may be included to prevent oxidation of superconductor layer 134 during fabrication of the SNSPD 100, if fabrication facilities used to fabricate SNSPD do not provide in-situ deposition of superconductor layer 134 and cap layer 136.

Figure 1D:
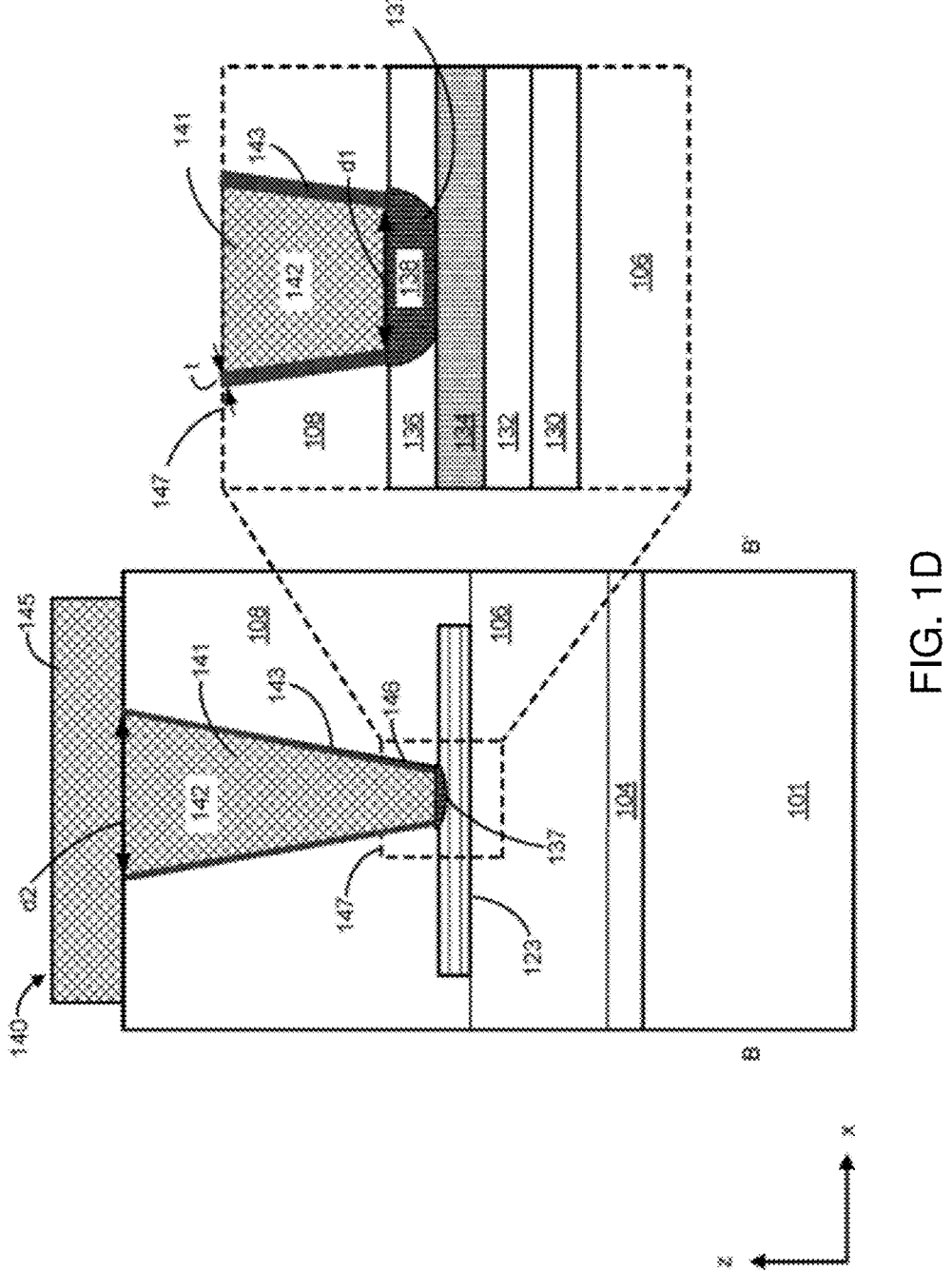
FIG. 1D is a vertical cross-sectional view along line B-B' across a contact portion of the superconducting nanowire single photon detector shown in FIG. 1A, in accordance with various embodiments.

FIG. 1D is a cross-sectional view of the SNSPD 100 cut across contact portions 123 (along line B-B' in FIG. 1A), according to some embodiments. As shown, the SNSPD 100 further includes a contact 140 above the contact portion 123 of the superconductor stack 102. According to some embodiments, the contact 140 includes a contact core 141 in a contact hole 142 formed in the third dielectric layer 108. The SNSPD 100 may further include a contact liner or outer layer 143 between the contact core 141 and the third dielectric layer 108. The contact 140 may further include a contact pad (or metal line) 145 above and electrically coupled with the contact core 141 and the contact liner 143. the contact core 141 may include a metallic material, such as tungsten, aluminum, copper, etc. The contact liner 143 may include a same or different metallic material, such as titanium (Ti), nickel (Ni), cobalt (Co), etc. In some embodiments, as shown in FIG. 1D, the contact hole 142 may have a diameter (or horizontal dimension) d1 of about 100 nm or more near the bottom 146 and a diameter (or horizontal dimension) d2 of about 100 nm or more near the contact pad 145, and contact liner 143 may have a thickness t1 of about 5 nm-100 nm.

FIG. 1D also includes an inset showing a zoomed in view of an area 147 near a bottom 146 of the contact 140. As shown, a region 137 of the cap layer 136 under and adjacent to the bottom 146 of the contact 140 is converted to a conductive compound 138, which provides low-resistance electrical coupling between the contact 140 and the superconductor layer 134. In some embodiments, the contact liner 143 may include Ti, Ni or Co and conductive compound 138 may include titanium silicide, nickel silicide, or cobalt silicide respectively.

Figure 1E:
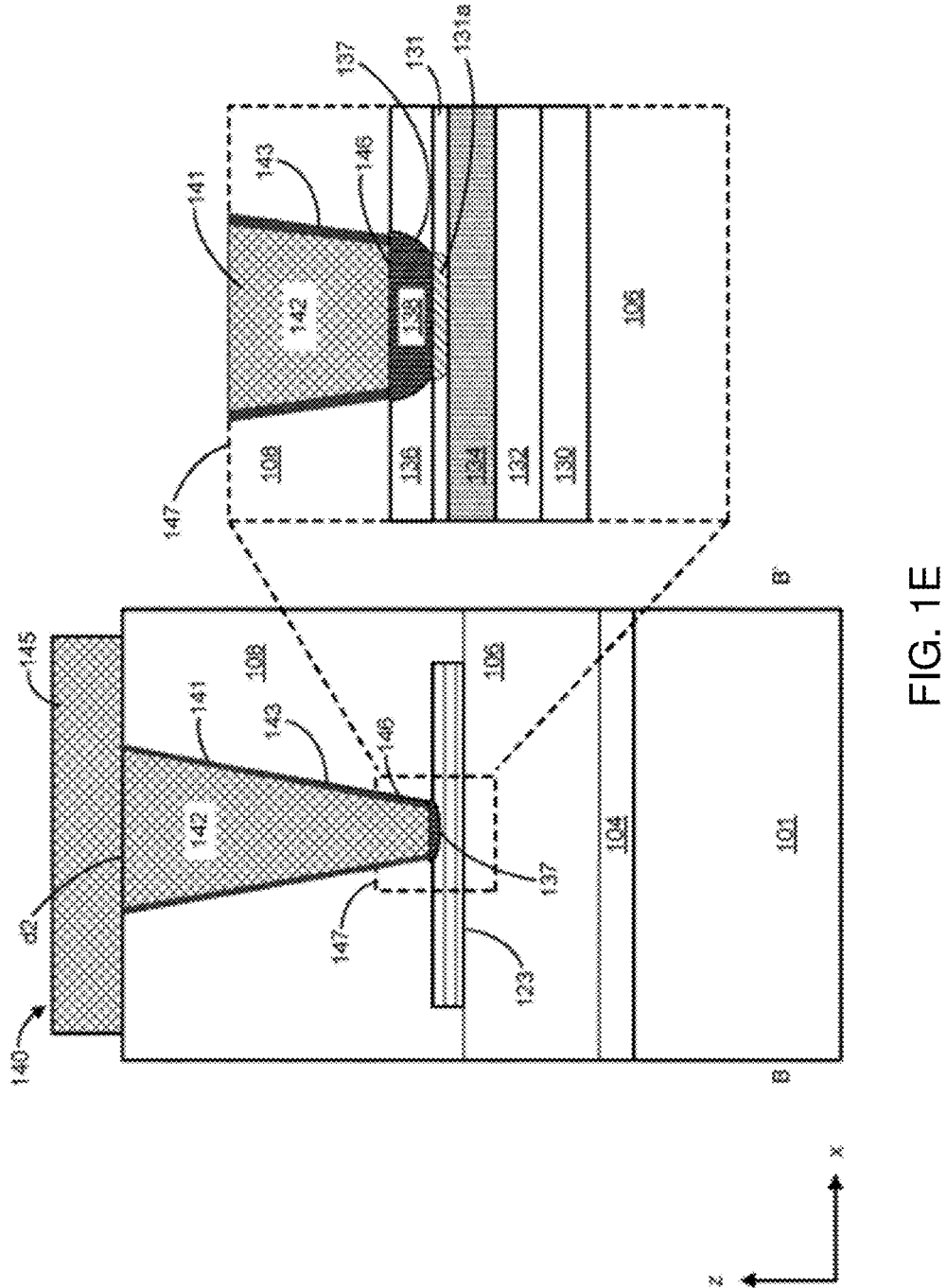
FIG. 1E illustrates a vertical cross-sectional view of a superconducting nanowire single photon detector that includes a protective layer, in accordance with various embodiments.
Figure 1F:
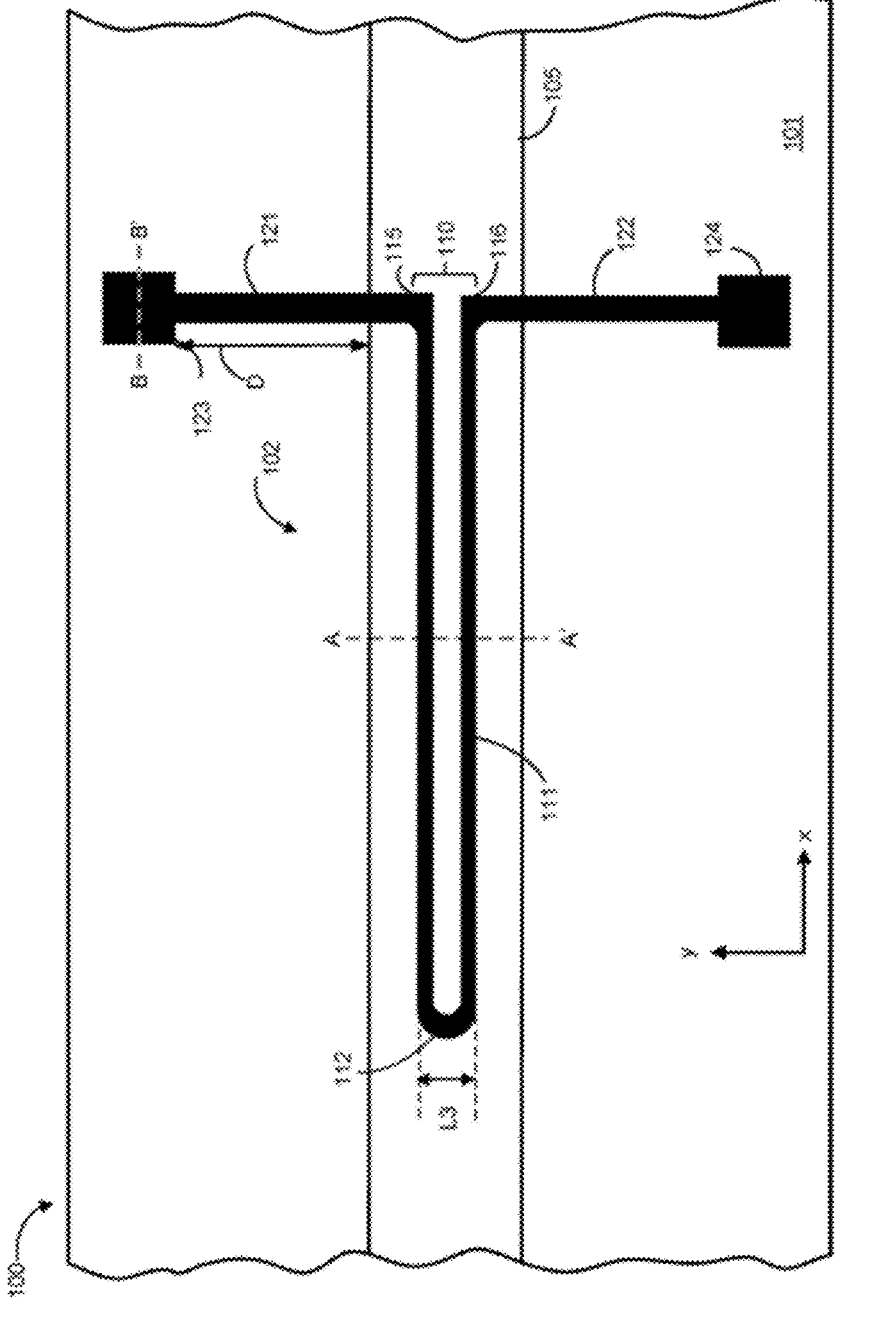
FIG. 1F illustrates plan view of a further superconducting nanowire single photon detector, in accordance with various embodiments.

FIG. 1E illustrates a cross-sectional view of the SNSPD 100 cut across contact portions 123 (along line B-B' in FIG. 1A), with an inset showing the superconductor stack 102 further including an optional protective layer 131 between the superconductor layer 134 and the cap layer 136, according to some embodiments, as discussed above with reference to FIG. 1C. In some embodiments, as shown in the inset in FIG. 1E, when the optional protective layer 131 is provided, the contact hole 142 may extend through the optional protective layer 131.

Figures 2A, 2B, 2C, 2D:
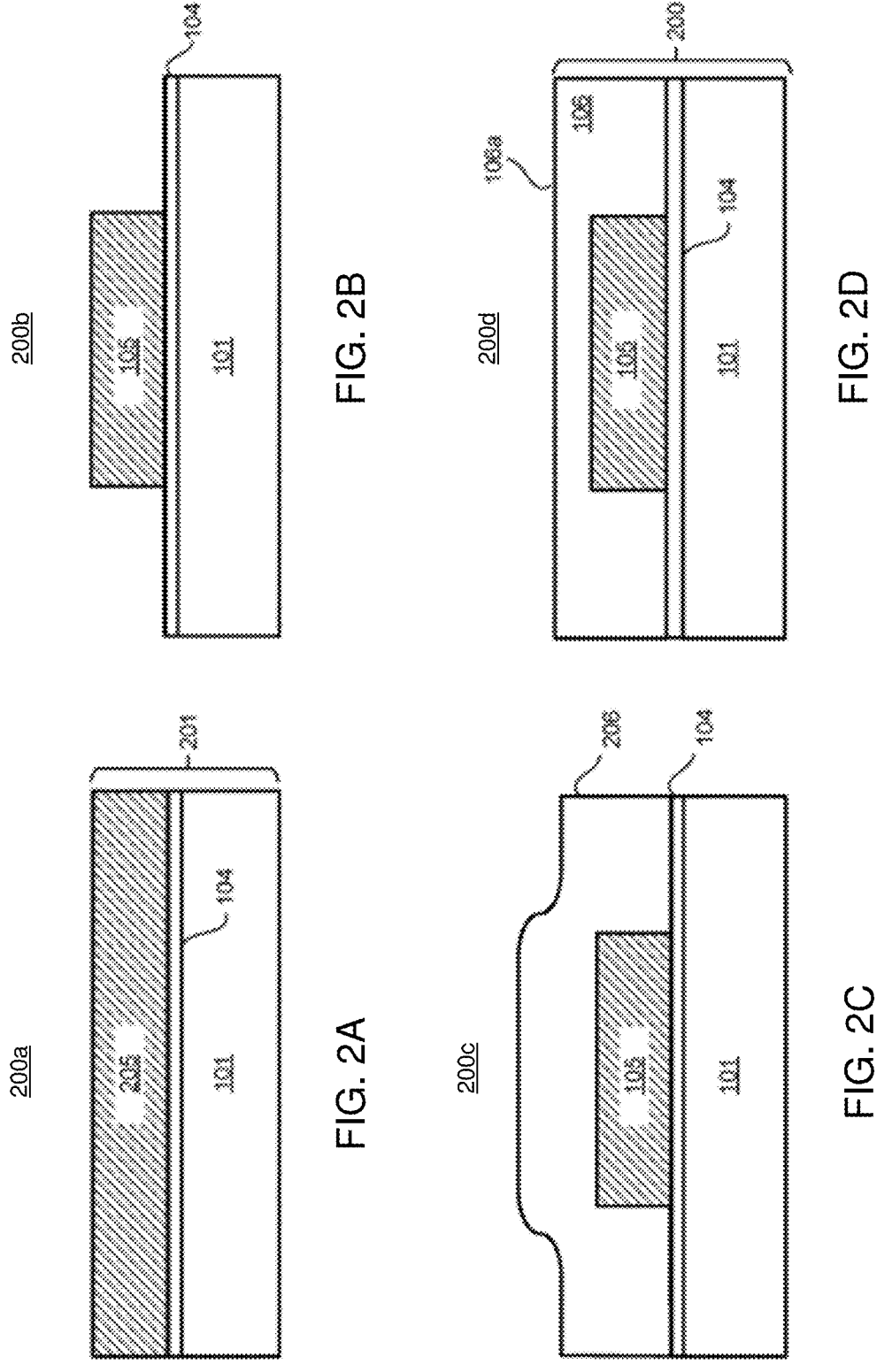
FIG. 2A illustrates a vertical cross-sectional view of an intermediate structure that may be used in forming a superconducting nanowire single photon detector, according to various embodiments.
FIG. 2B illustrates a vertical cross-sectional view of a further intermediate structure that may be used in forming a superconducting nanowire single photon detector, according to various embodiments.
FIG. 2C illustrates a vertical cross-sectional view of a further intermediate structure that may be used in forming a superconducting nanowire single photon detector, according to various embodiments.
FIG. 2D illustrates a vertical cross-sectional view of a further intermediate structure that may be used in forming a superconducting nanowire single photon detector, according to various embodiments.

FIG. 2A illustrates a vertical cross-sectional view of an intermediate structure 200*a* that may be used in forming an SNSPD, according to various embodiments. The intermediate structure 200*a* may include a semiconductor-on-insulator (SOI) substrate 201 that may include a semiconductor substrate 101 (e.g., silicon, gallium arsenide, etc.), a first dielectric layer 104 over the substrate 101, and a semiconductor layer 205 (e.g., silicon, gallium arsenide, etc.) over the first dielectric layer 104.

FIG. 2B illustrates a vertical cross-sectional view of a further intermediate structure 200*b* that may be used in forming an SNSPD, according to various embodiments. The intermediate structure 200*b* may be formed by patterning the semiconductor layer 205 to form a waveguide 105. In this regard, a blanket layer of a photoresist (not shown) may be deposited over the semiconductor layer 205. The photoresist may then be patterned using photolithography techniques to thereby generate a patterned mask that may be used for etching the semiconductor layer 205. For example, an anisotropic etching (e.g., plasma or reactive ion etching) process may be performed to etch the semiconductor layer 205 to thereby form the waveguide 105 on the first dielectric layer 104, as shown in FIG. 2B. The photoresist may then be removed by ashing or by dissolution with a solvent.

FIG. 2C illustrates a vertical cross-sectional view of a further intermediate structure 200*c* that may be used in forming an SNSPD, according to various embodiments. The intermediate structure 200*c* may be formed by forming a second dielectric layer 206 over the waveguide 105 and the first dielectric layer 104. The second dielectric layer 206 (e.g., silicon dioxide) may be deposited using, for example, chemical vapor deposition (CVD).

FIG. 2D illustrates a vertical cross-sectional view of a further intermediate structure 200*d* that may be used in forming an SNSPD, according to various embodiments. The intermediate structure 200*d* may be formed by performing a planarization operation on the second dielectric layer 206 to thereby form a planarized surface on the second dielectric layer 106. The second dielectric layer 206 may be planarized using, for example, chemical mechanical planarization (CMP), resulting in a flat surface 106*a*, on which a superconductor nanowire may subsequently be formed. For example, the superconductor nanowire to be formed over the cladding (e.g., the second dielectric layer 106) of the waveguide 105 may be wider than the waveguide 105, as described in further detail, below. In this way, the intermediate structure 200*d* may form a composite substrate 200 on which a superconductor nanowire may be formed. As shown in FIG. 2D, for example, the composite substrate 200 may include the substrate 101, the first dielectric layer 104, the waveguide 105, and the second dielectric layer 106.

Figures 2E, 2F:
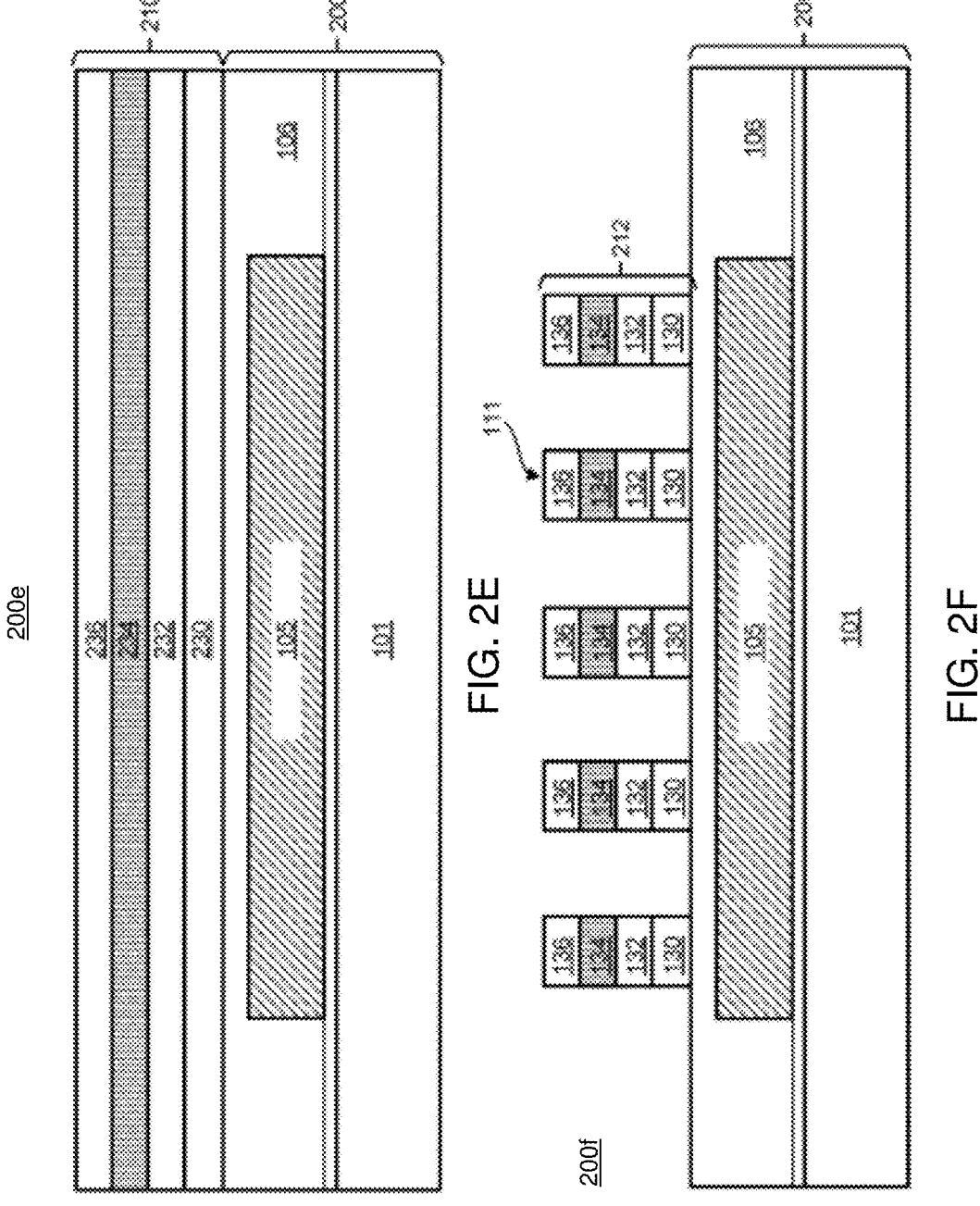
FIG. 2E illustrates a vertical cross-sectional view of a further intermediate structure that may be used in forming a superconducting nanowire single photon detector, according to various embodiments.
FIG. 2F illustrates a vertical cross-sectional view of a nanowire single photon detector including a plurality of superconducting nanowires formed over a waveguide, according to various embodiments.

FIG. 2E illustrates a vertical cross-sectional view of a further intermediate structure 200*e* that may be used in forming an SNSPD, according to various embodiments. The intermediate structure 200*e* may be formed by forming a multilayer thin film stack 210 over the composite substrate 200 of FIG. 2D. In some embodiments, multilayer thin film stack 210 may include a layer of a first material 230, a layer of a second material 232 formed over (e.g., on top of, on a surface of) the layer of the first material 230, a layer of a third material 234 formed over (e.g., on top of, on a surface of) the layer of the second material 232, and a layer of a fourth material 236 formed over (e.g., on top of, on a surface of) the layer of the third material 234.

In some embodiments, the layer of the first material 230 may include silicon and nitrogen (e.g., SiN), the layer of the second material 232 may include aluminum and nitrogen (e.g., AlN), the layer of the third material 234 may include niobium and one or more of nitrogen, titanium, aluminum, germanium, and tin (e.g., NbN, NbTi, NbAl, NbGe, NbSn, etc.), and the layer of the fourth material 236 may include silicon (e.g., a-Si, poly-Si, or mono c-Si). In some embodiments, each layer in the multilayer thin film stack 210 may have a thickness that may be greater than 2 nm and less than 40 nm. In some embodiments, the layer of the first material 230 may be greater than 10 nm and less than 20 nm, the layer of the second material 232 and the layer of the third material 234 may each be greater than 5 nm and less than 10 nm, the layer of the fourth material 236 may be greater than 3 nm and less than 10 nm.

In some embodiments, the layer of the first material 230 may be deposited onto the composite substrate 200 using a process suitable for depositing an ultrathin film (e.g., 10 nm-20 nm) including silicon and nitrogen (e.g., SiN), such as, for example, CVD, physical vapor deposition (PVD), plasma-enhanced chemical vapor deposition (PECVD), catalytic chemical vapor deposition (Cat-CVD), hot wire chemical vapor deposition (HWCVD), etc. In some embodiments, the layer of the second material 232 may be deposited onto the layer of first material 230 using a process suitable for depositing an ultrathin film (e.g., 5 nm-10 nm) including aluminum and nitrogen (e.g., AlN), such as, for example, CVD, PECVD, PVD, magnetron sputtering (MS), molecular beam epitaxy (MBE), atomic layer deposition (ALD), plasma-enhanced atomic layer deposition (or PEALD), etc.

In some embodiments, the layer of the third material 234 may be deposited onto the layer of the second material 232 using a process suitable for depositing an ultrathin (e.g., 2 nm-40 nm) film including a superconductor compound (e.g., NbN, NbTi, NbAl, NbGe, or NbSn), such as, for example, CVD, PVD, PECVD, MS, MBE, ALD, PEALD, etc. In some embodiments, the layer of the fourth material 236 may be deposited onto the layer of the third material 234 using a process suitable for depositing an ultrathin (e.g., 2 nm-40 nm) film including silicon (e.g., a-Si, poly-Si, or mono c-Si), such as, for example, CVD, PECVD, MS, MBE, ALD, PEALD, etc. In some embodiment, the layer of the fourth material 236 may include a-Si because a-Si can be deposited at relative low temperature (e.g., 75 degrees Celsius) using a CVD process that causes little or no damage the underlying superconductor layer (i.e., third material 234).

FIG. 2F illustrates a vertical cross-sectional view of a further intermediate structure 200*f* that may be used in forming an SNSPD, according to various embodiments. The intermediate structure 200*f* of FIG. 2F may be formed by patterning the multilayer thin film stack 210 (e.g., see FIG.

2E) to form a patterned multilayer stack 212. The multilayer thin film stack 210 may be patterned using a plurality of fabrication processes including, for example, a high-resolution lithography process to form a mask on the multilayer thin film stack 210, and one or more anisotropic etching processes to successively etch away exposed portions of the layer of the fourth material 236, the layer of the third material 234, the layer of the second material 232, and the layer of the first material 230. At least the layer of the first material 230 may be etched using an anisotropic process that is selective to the second dielectric layer 106. FIG. 2F shows a vertical cross-sectional view of the resulting patterned multilayer stack 212, according to various embodiments.

After formation of the patterned multilayer stack 212 by patterning the multilayer thin film stack 210, the remaining portion of the layer of the first material 230 becomes a barrier layer 130, the remaining portion of the layer of the second material 232 becomes a seed layer 132, the remaining portion of the layer of the third material 234 becomes a superconductor layer 134, and the remaining portion of the layer of the fourth material 236 becomes a cap layer 136.

In some embodiments, the layer of the second material 232 acts as a seed layer for improved surface morphology during subsequent deposition of the layer of the third material 234, resulting in enhanced qualities of superconductor layer 134. The barrier layer 130 acts as a barrier between the superconductor layer 134 and the second dielectric layer 106, preventing or reducing oxidation of the superconductor layer 134 from oxygen released from the second dielectric layer 106 during and/or after fabrication of the SNSPD 100 (e.g., see FIGS. 1A and 1F).

Figure 3A:
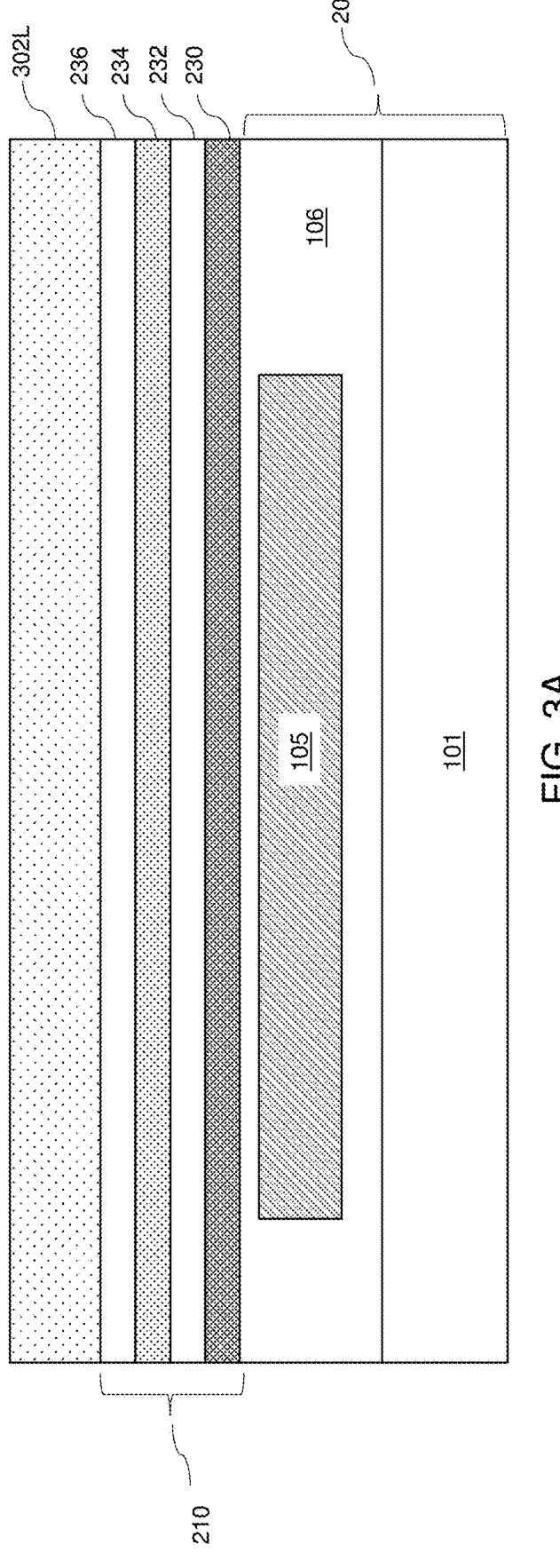
FIG. 3A illustrates a vertical cross-sectional view of an intermediate structure that may be used in forming a superconducting nanowire single photon detector, according to various embodiments.
Figure 3B:
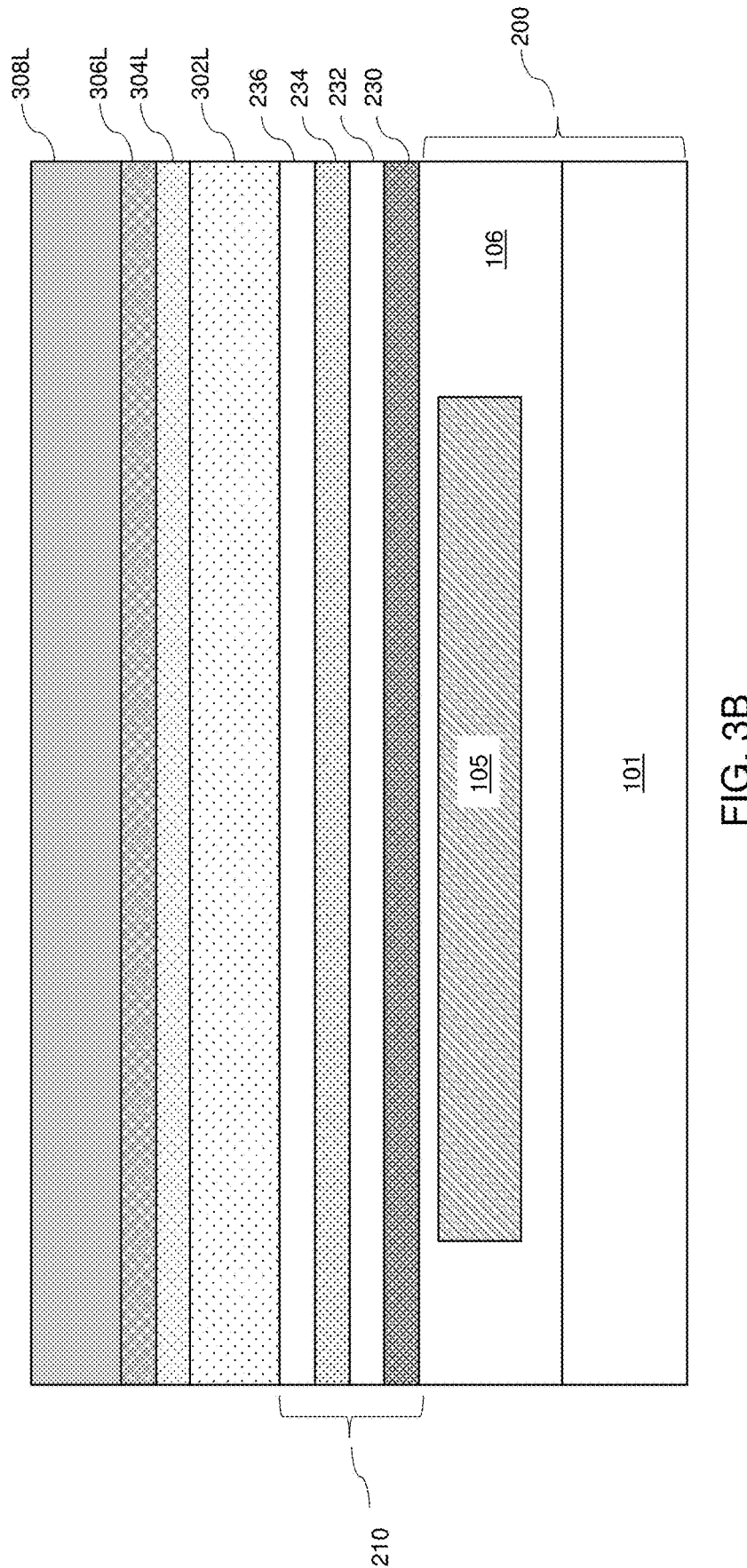
FIG. 3B illustrates a vertical cross-sectional view of a further intermediate structure that may be used in forming a superconducting nanowire single photon detector, according to various embodiments.
Figure 3C:
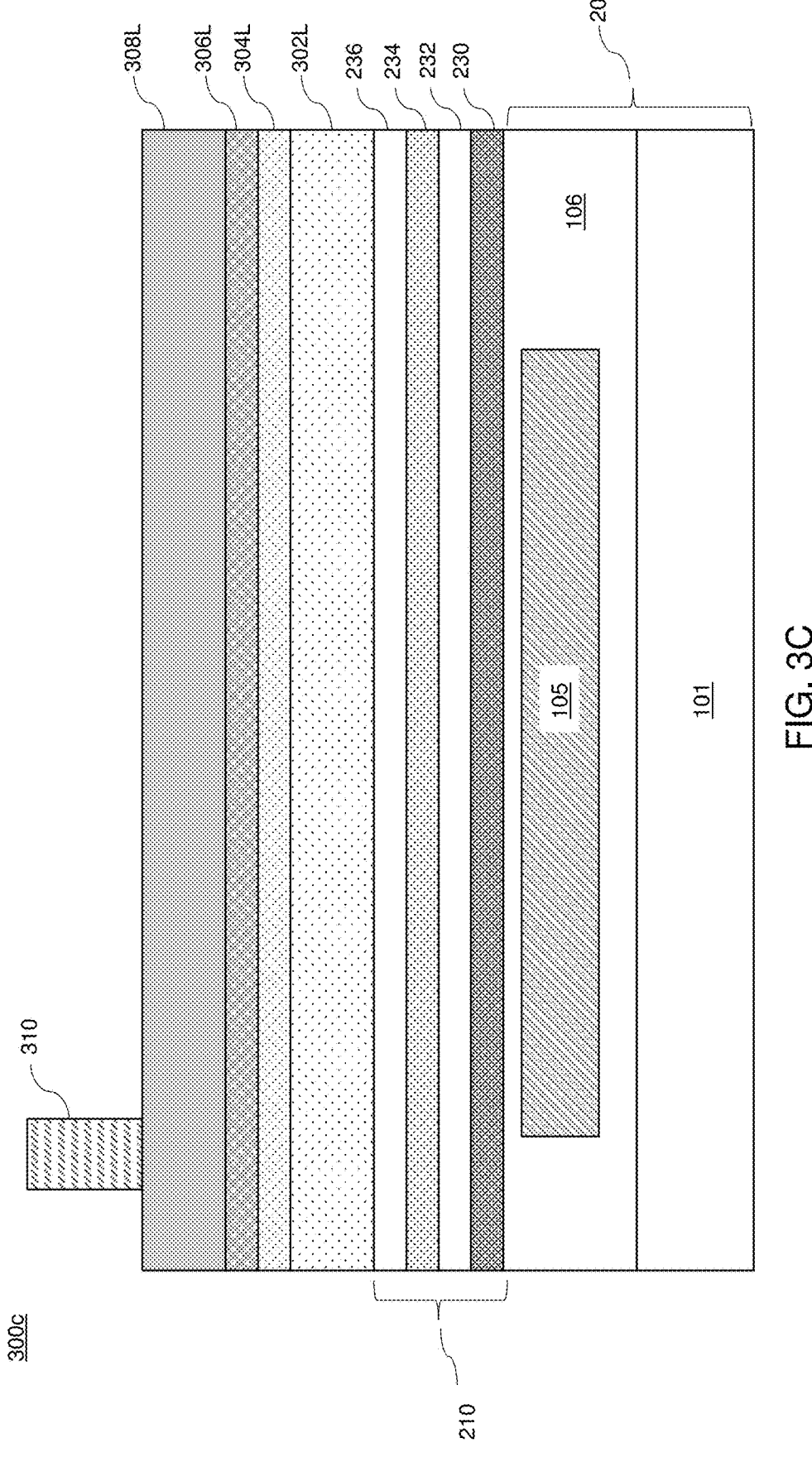
FIG. 3C illustrates a vertical cross-sectional view of a further intermediate structure that may be used in forming a superconducting nanowire single photon detector, according to various embodiments.
Figure 3D:
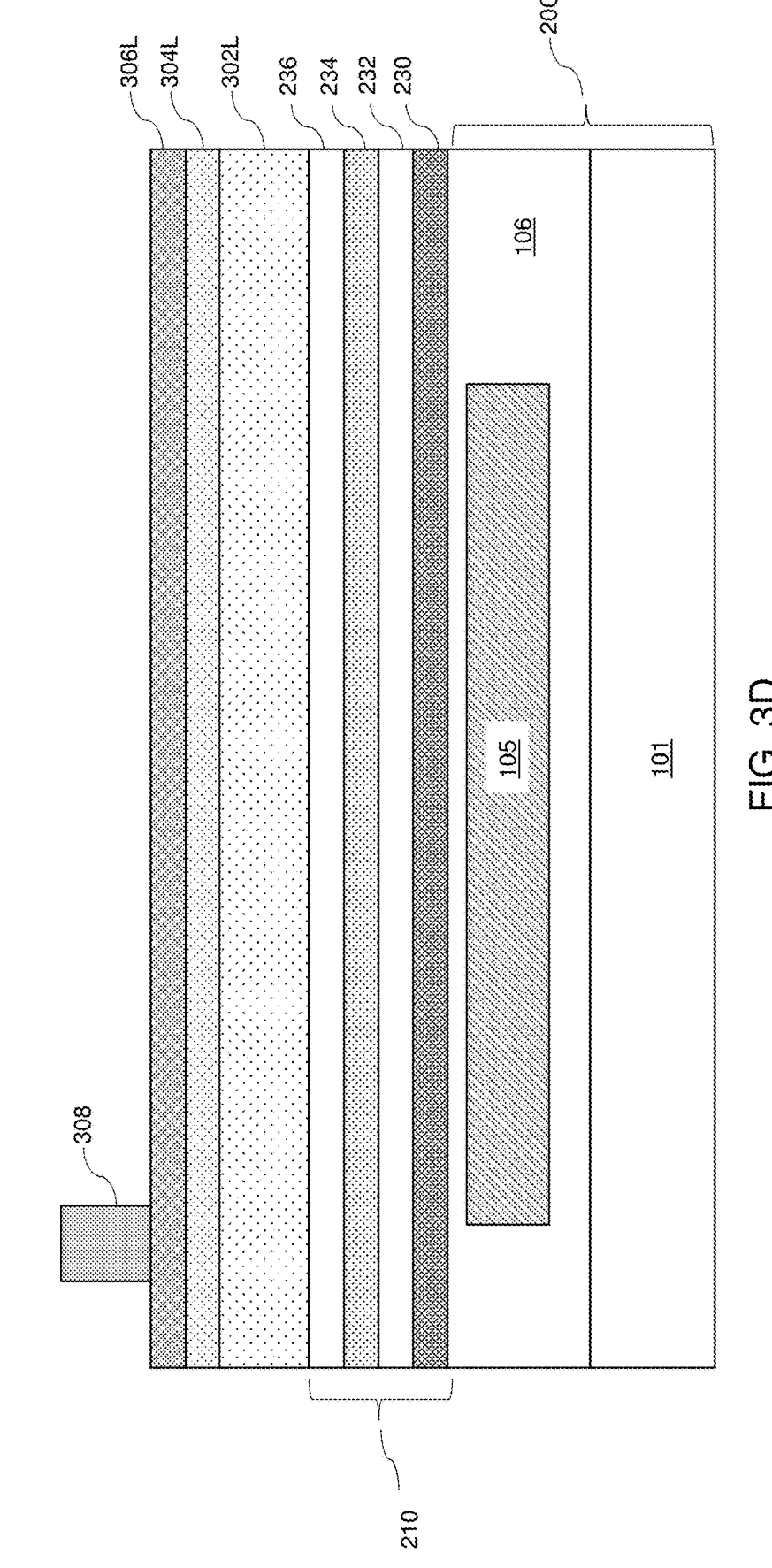
FIG. 3D illustrates a vertical cross-sectional view of a further intermediate structure that may be used in forming a superconducting nanowire single photon detector, according to various embodiments.
Figure 3E:
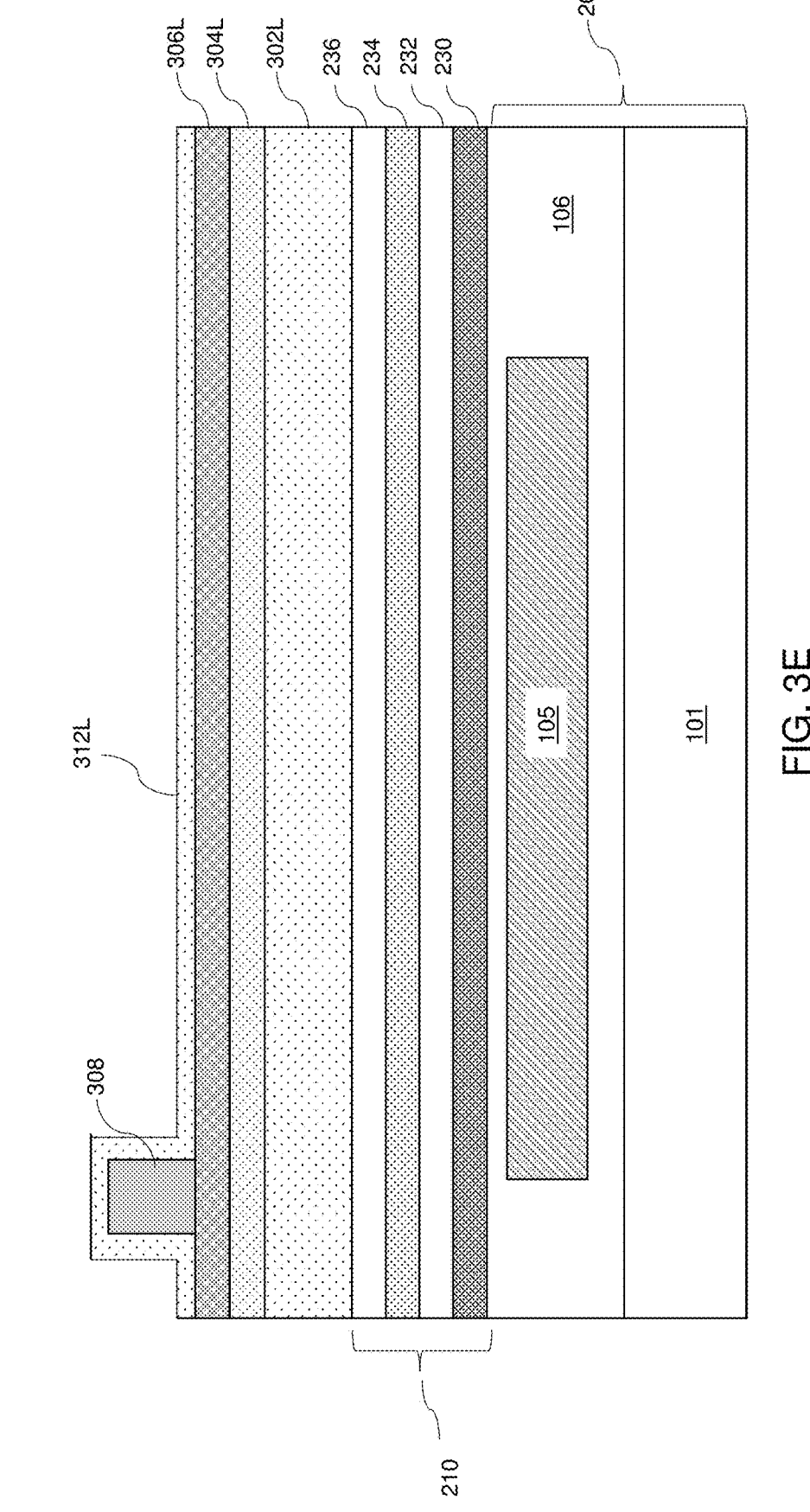
FIG. 3E illustrates a vertical cross-sectional view of a further intermediate structure that may be used in forming a superconducting nanowire single photon detector, according to various embodiments.
Figure 3F:
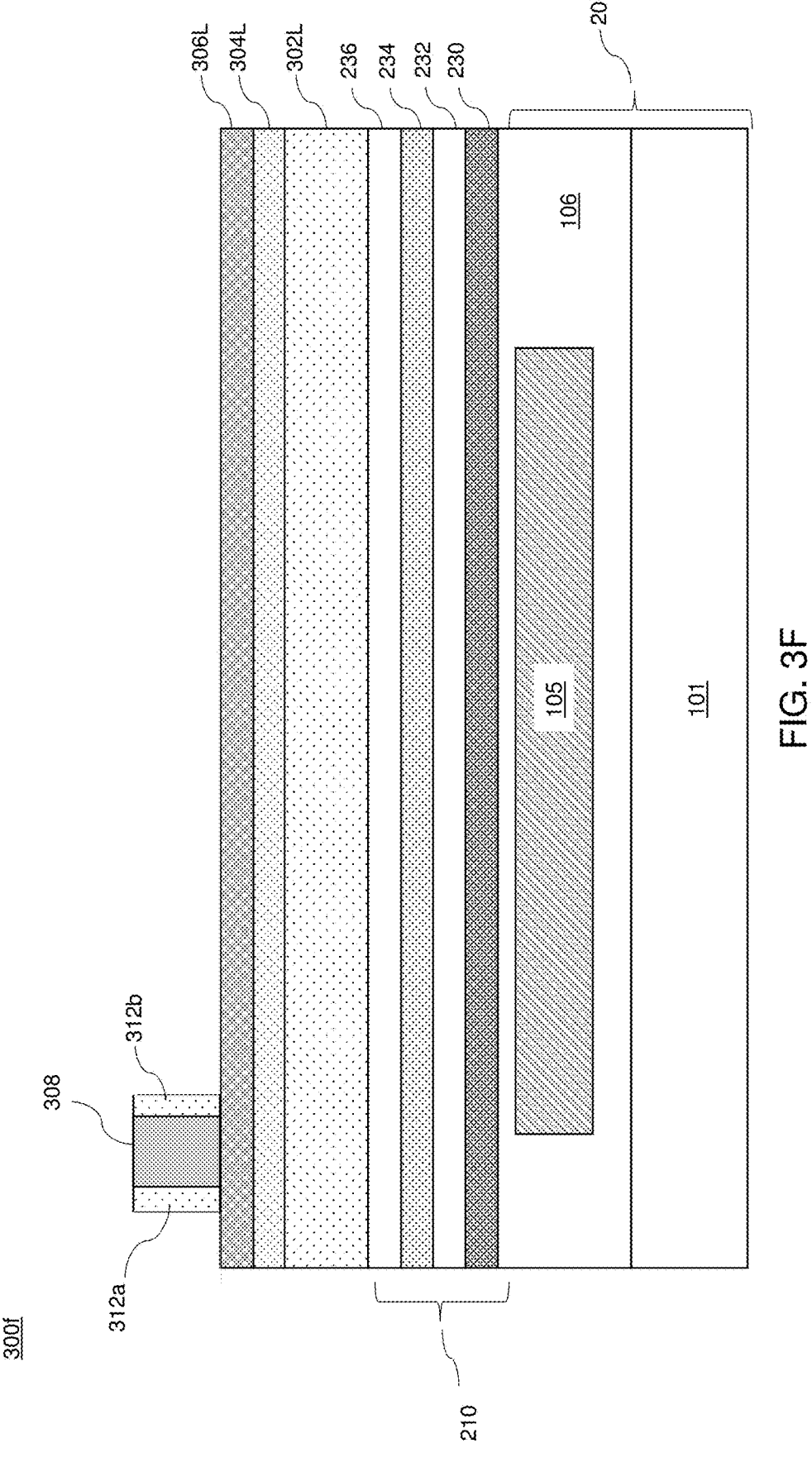
FIG. 3F illustrates a vertical cross-sectional view of a further intermediate structure that may be used in forming a superconducting nanowire single photon detector, according to various embodiments.
Figure 3G:
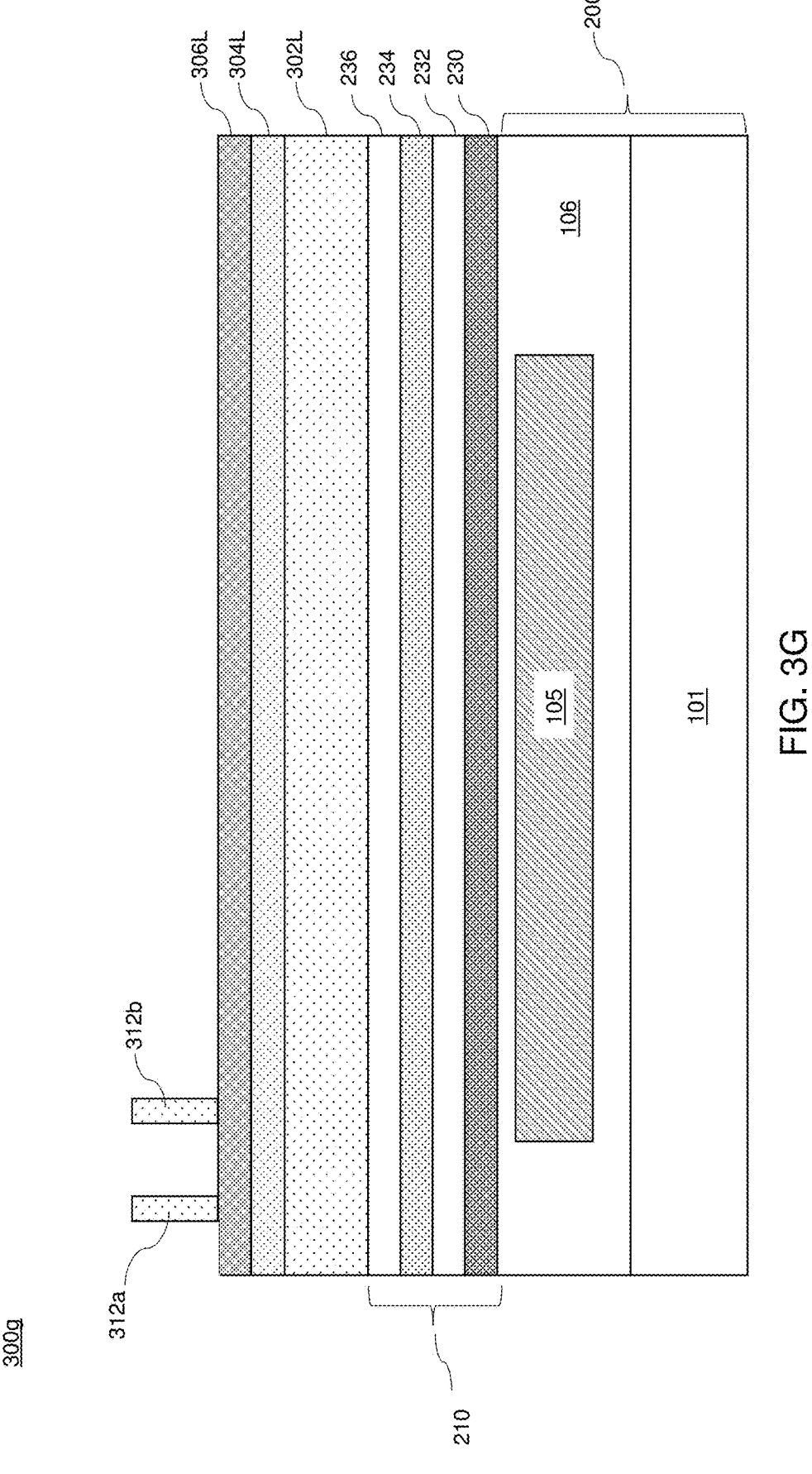
FIG. 3G illustrates a vertical cross-sectional view of a further intermediate structure that may be used in forming a superconducting nanowire single photon detector, according to various embodiments.
Figure 3H:
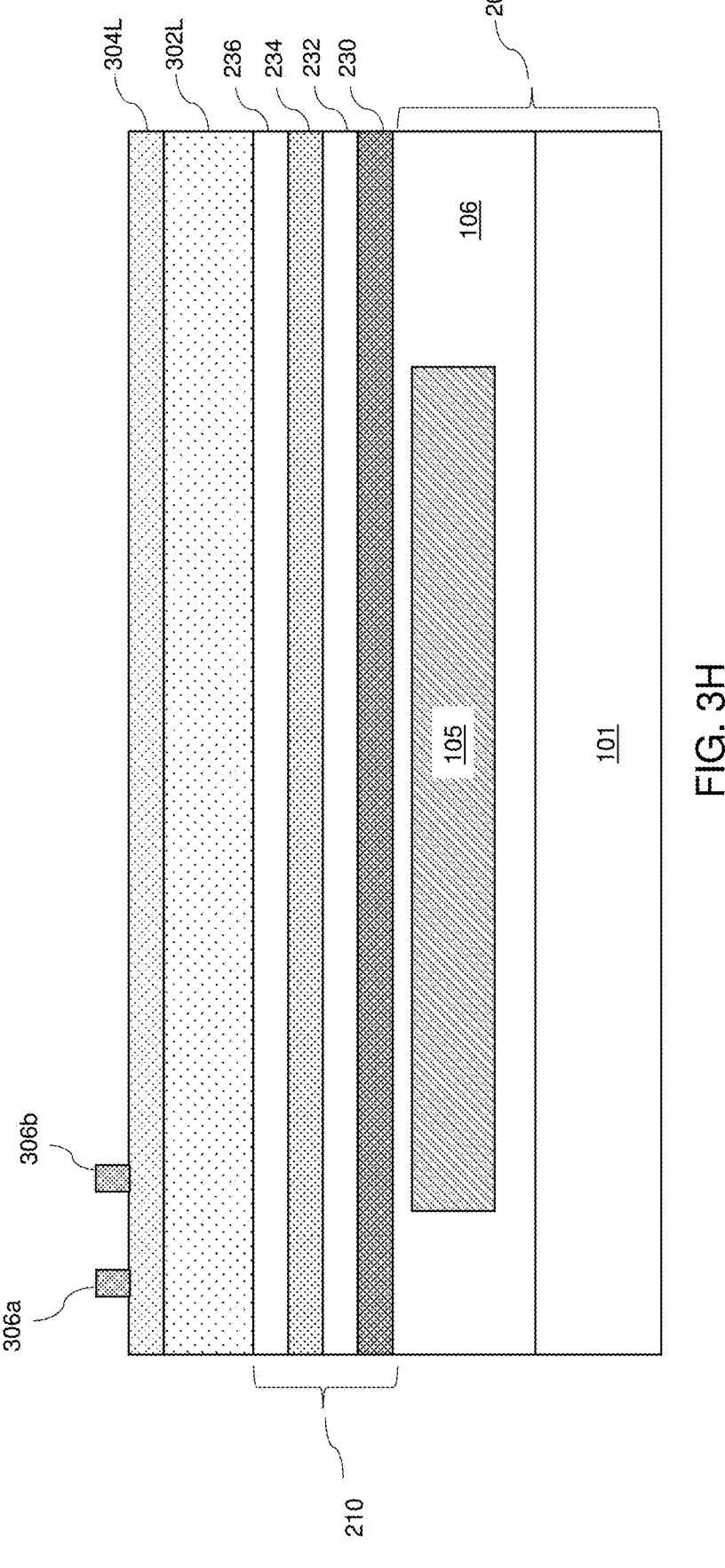
FIG. 3H illustrates a vertical cross-sectional view of a further intermediate structure that may be used in forming a superconducting nanowire single photon detector, according to various embodiments.
Figure 3I:
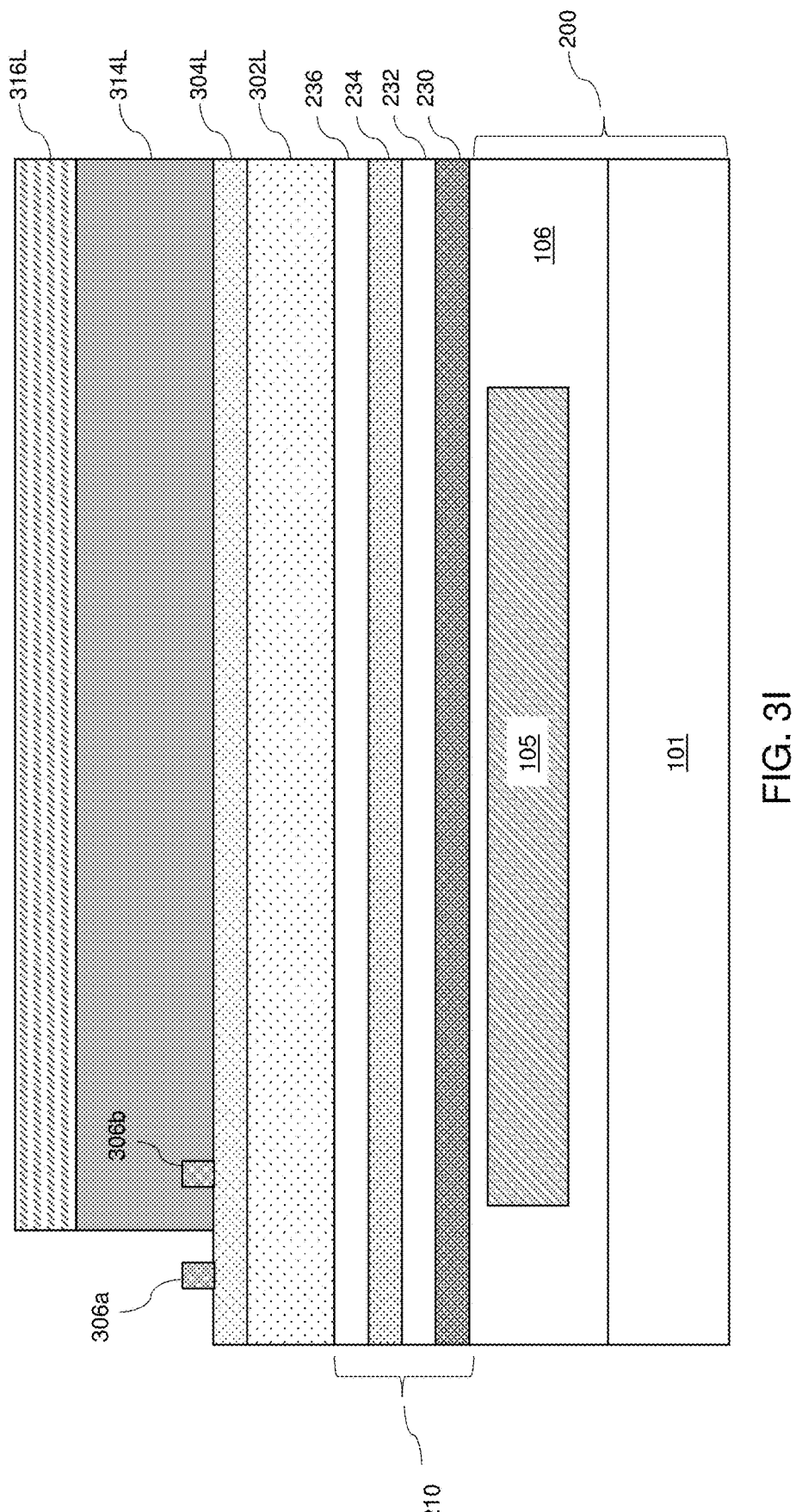
FIG. 3I illustrates a vertical cross-sectional view of a further intermediate structure that may be used in forming a superconducting nanowire single photon detector, according to various embodiments.
Figure 3J:
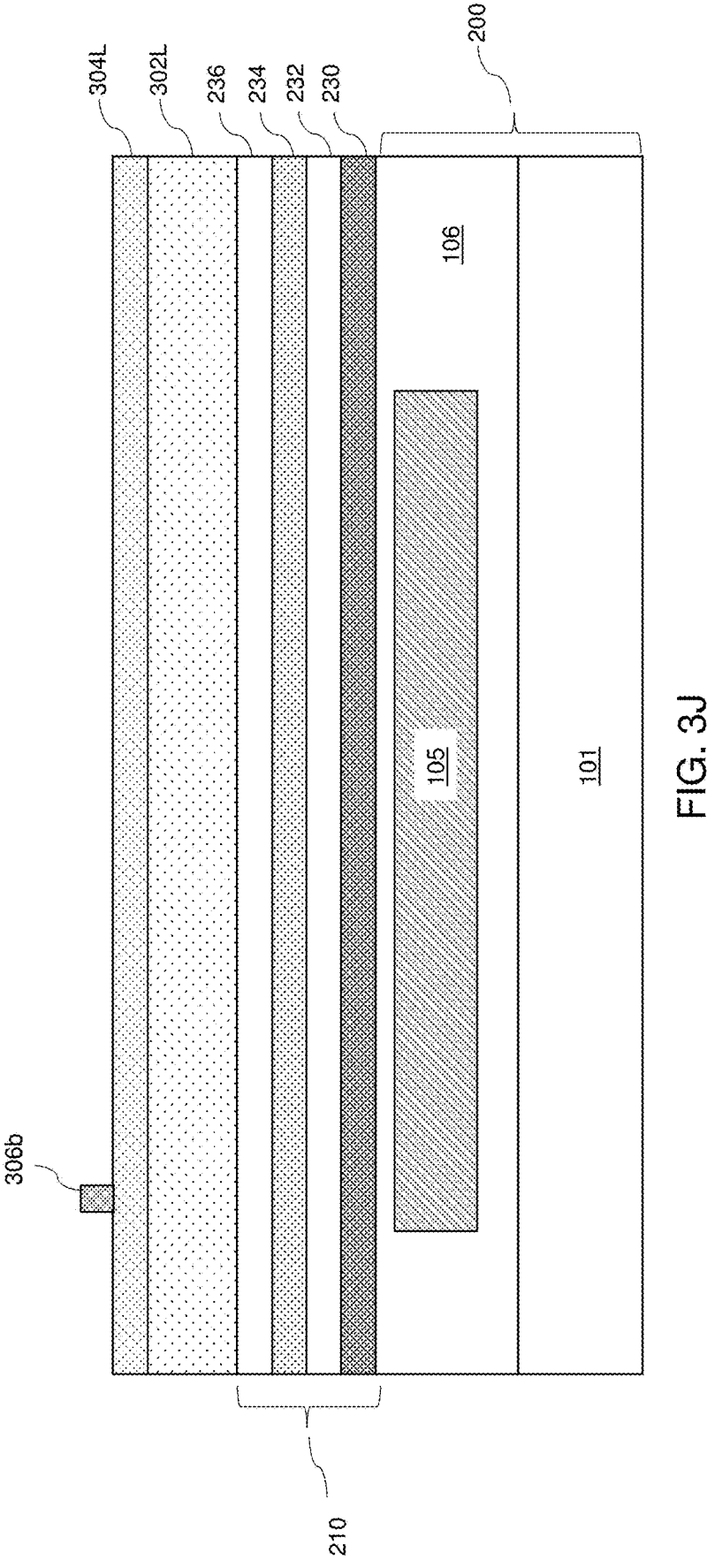
FIG. 3J illustrates a vertical cross-sectional view of a further intermediate structure that may be used in forming a superconducting nanowire single photon detector, according to various embodiments.
Figure 3K:
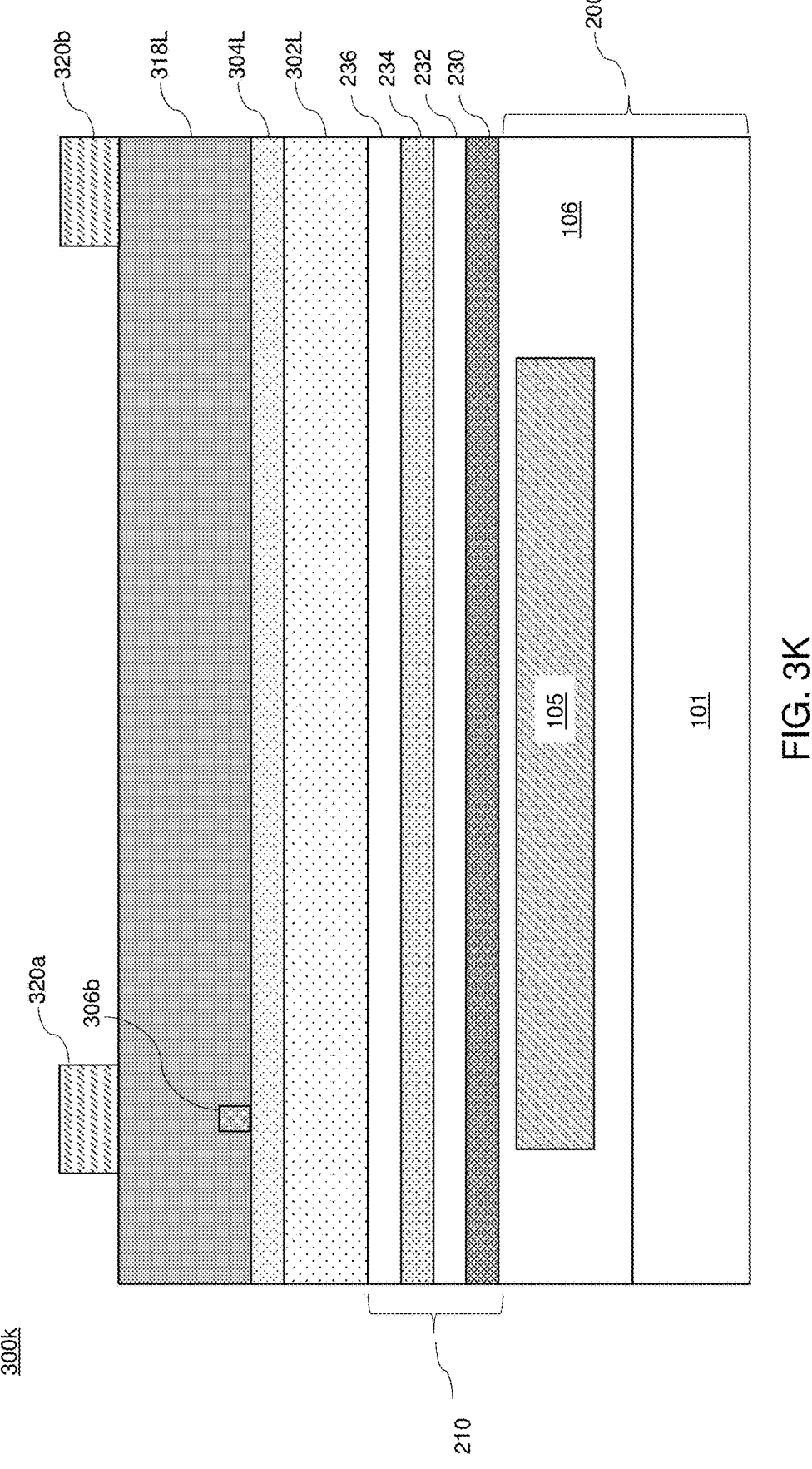
FIG. 3K illustrates a vertical cross-sectional view of a further intermediate structure that may be used in forming a superconducting nanowire single photon detector, according to various embodiments.
Figure 3L:
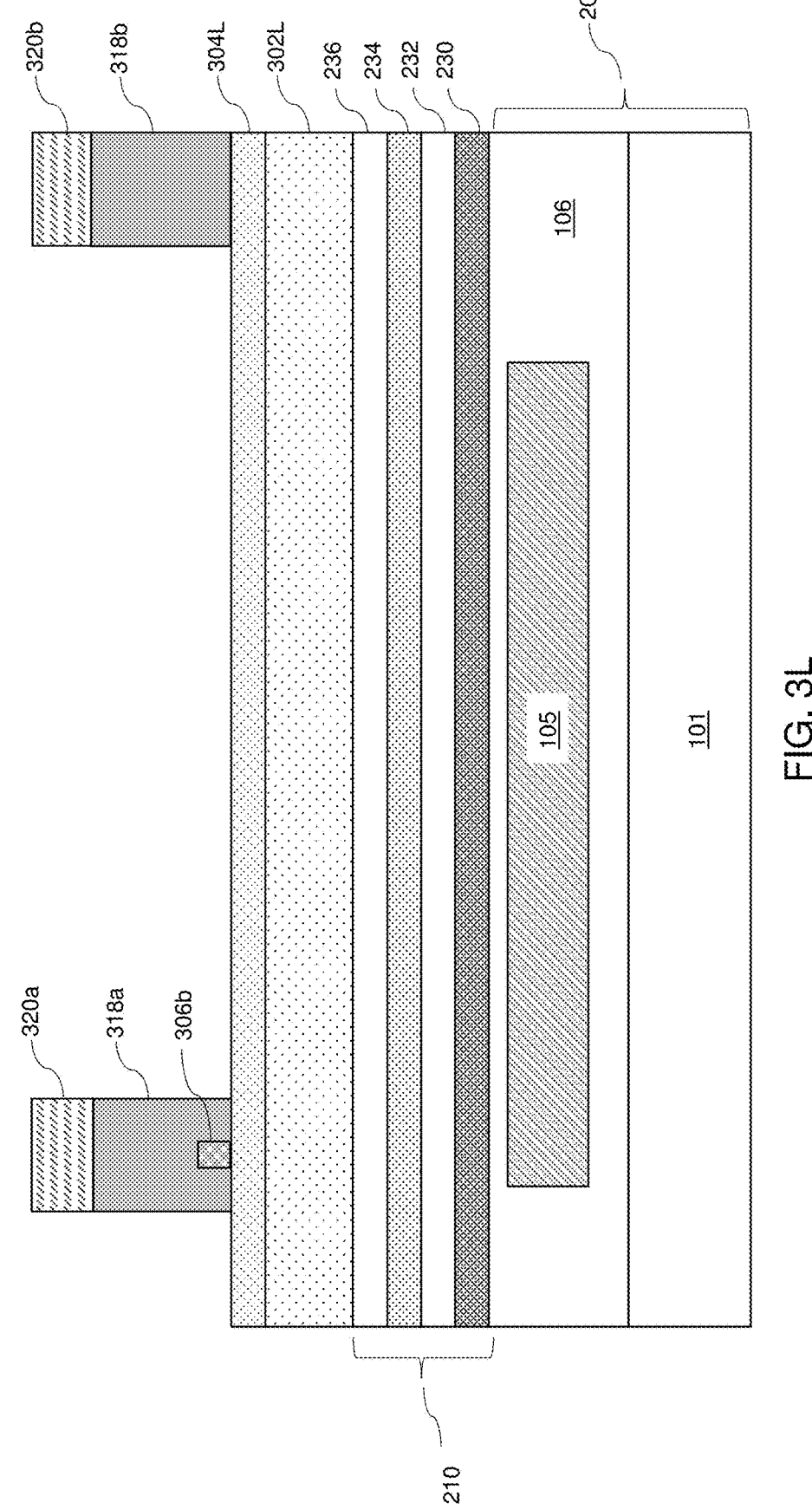
FIG. 3L illustrates a vertical cross-sectional view of a further intermediate structure that may be used in forming a superconducting nanowire single photon detector, according to various embodiments.
Figures 4A, 4B, 4C:
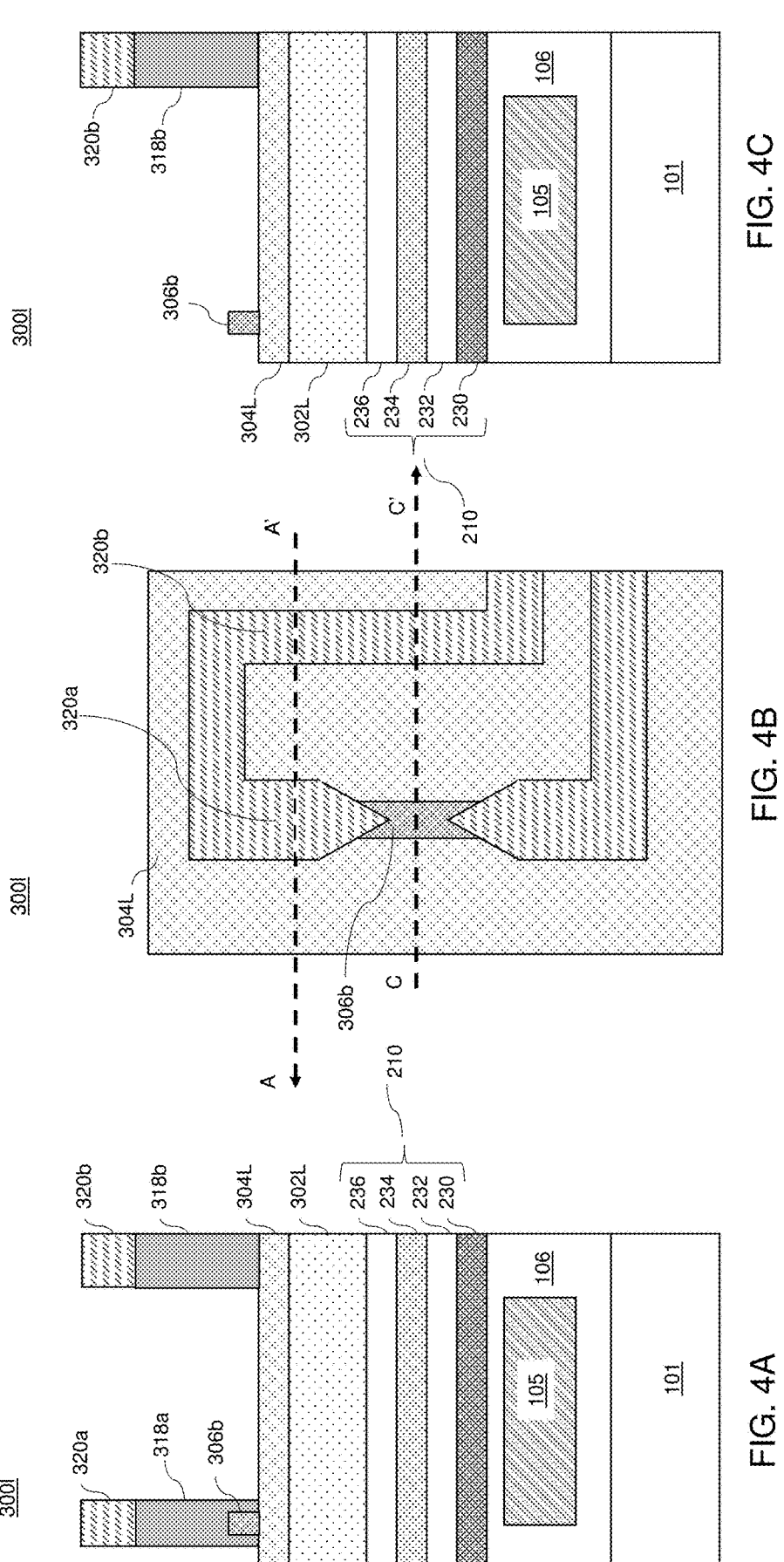
FIG. 4A illustrates a vertical cross-sectional view of an intermediate structure that may be used in forming a super-conducting nanowire single photon detector, according to various embodiments.
FIG. 4B illustrates a vertical cross-sectional view of a further intermediate structure that may be used in forming a superconducting nanowire single photon detector, according to various embodiments.
FIG. 4C illustrates a vertical cross-sectional view of a further intermediate structure that may be used in forming a superconducting nanowire single photon detector, according to various embodiments.
Figures 4D, 4E, 4F:
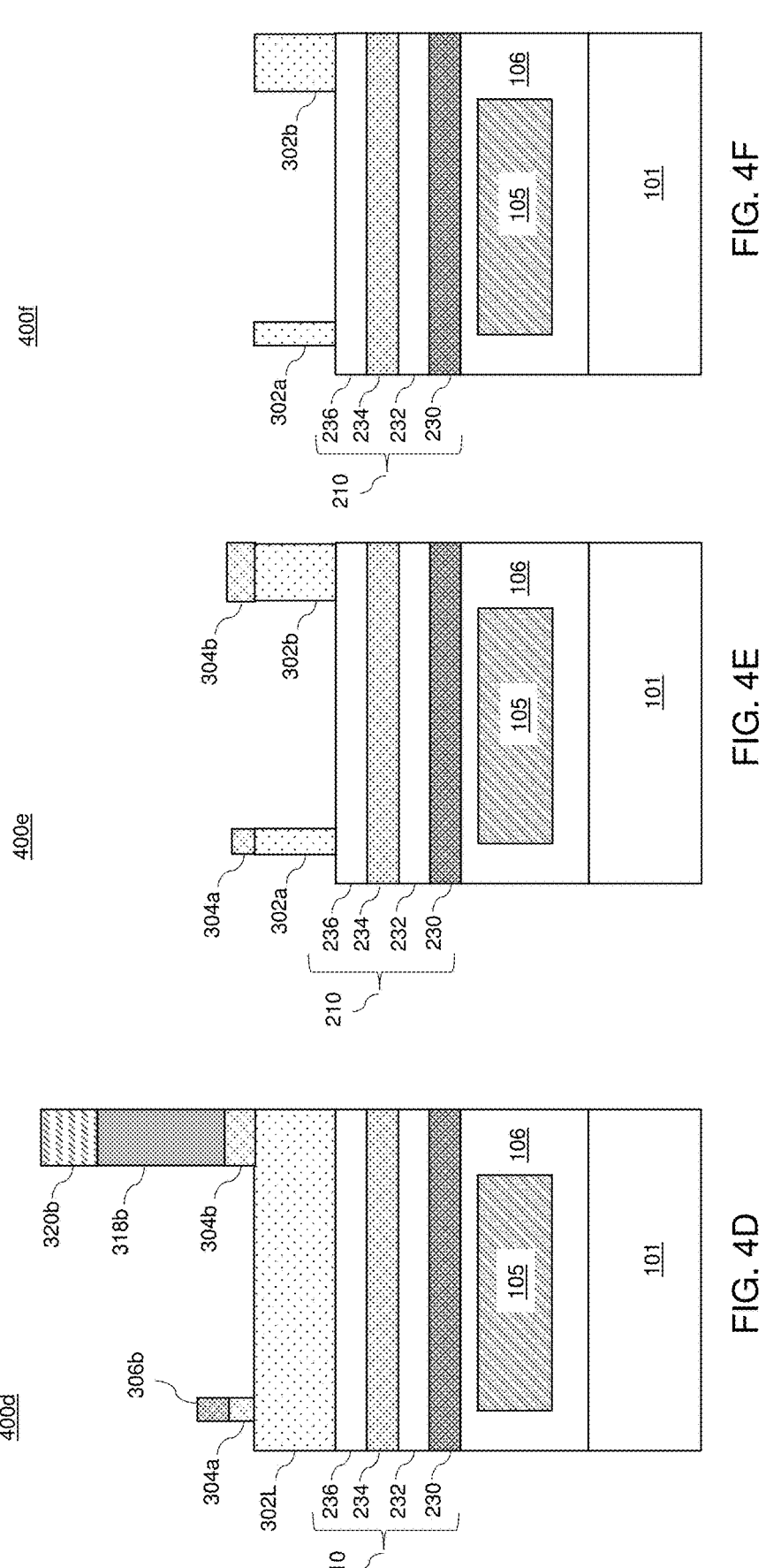
FIG. 4D illustrates a vertical cross-sectional view of a further intermediate structure that may be used in forming a superconducting nanowire single photon detector, according to various embodiments.
FIG. 4E illustrates a vertical cross-sectional view of a further intermediate structure that may be used in forming a superconducting nanowire single photon detector, according to various embodiments.
FIG. 4F illustrates a vertical cross-sectional view of a further intermediate structure that may be used in forming a superconducting nanowire single photon detector, according to various embodiments.
Figure 4H:
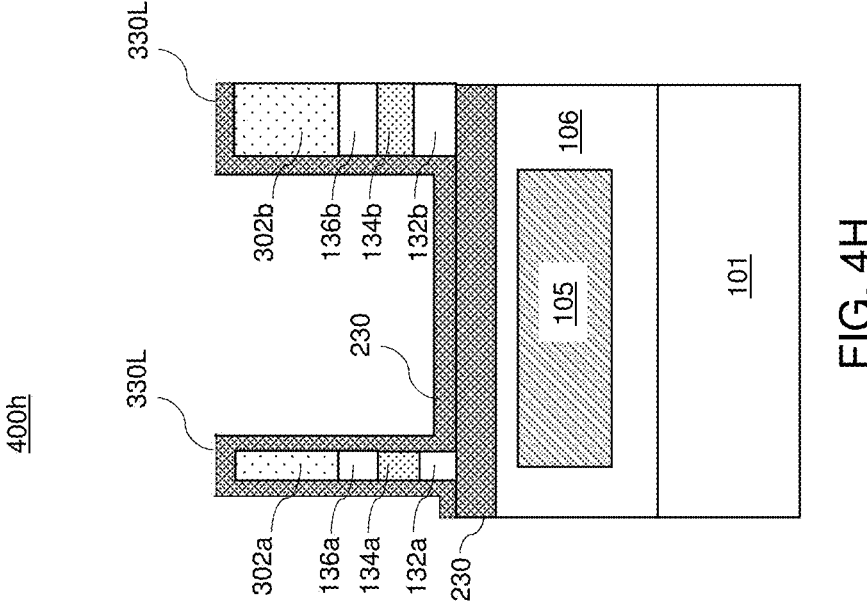
FIG. 4H illustrates a vertical cross-sectional view of a further superconducting nanowire single photon detector, which further includes an encapsulation layer formed over the structure of FIG. 4G, according to various embodiments.
Figure 4G:
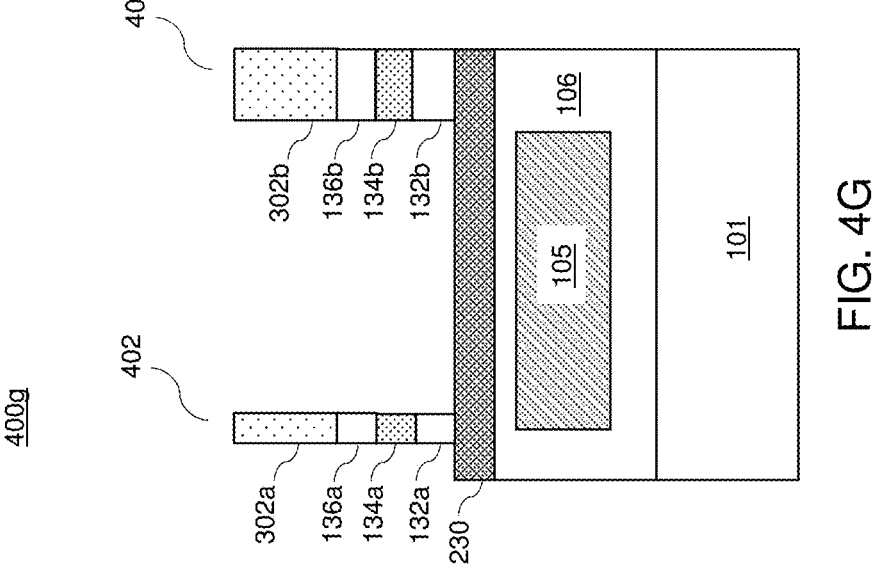
FIG. 4G illustrates a vertical cross-sectional view of a nanowire single photon detector superconducting detector that includes a nanowire formed over a waveguide, according to various embodiments.

FIGS. 3A to 4F illustrate various intermediate structures that may be used in the formation of an SNSPD, and FIGS. 4G and 4H illustrate configurations of an SNSPD, according to various embodiments. In the embodiments described below, a sidewall image transfer (SIT) process may be used to reduce the width of superconducting nanowires, to improve line edge roughness (LER), and to improve critical dimension (CD) uniformity. Nanowires and wider contact wire structures may be fabricated and connected to one another in a single lithographic process.

FIG. 3A illustrates a vertical cross-sectional view of an intermediate structure 300a that may be used in forming an SNSPD, according to various embodiments. The intermediate structure 300a of FIG. 3A is similar to the intermediate structure 200e of FIG. 2E. In this regard, the intermediate structure 300a may include the multilayer thin film stack 210 formed over the composite substrate 200, as described above. Rather than directly patterning the multilayer thin film stack 210 as was done in forming the patterned multilayer stack 212 of FIG. 2F, however, various additional masking layers may be formed over the structure of FIG. 2E. Such additional masking layers may be used in the SIT process mentioned above and described in greater detail below. For example, the intermediate structure 300a may further include a first hard mask layer 302L. The first hard mask layer 302L may include an oxide material (e.g., $SiO_2$, etc.) formed as a planar blanket (i.e., un-patterned) layer having a planar top surface and a planar bottom surface. The first hard mask layer 302L may be formed using CVD, PVD, ALD or any other suitable process. The first hard mask layer 302L may be deposited by a conformal deposition process (such as low pressure CVD) or a self-planarizing deposition process (such as spin coating). Excess portions of the first hard mask layer 302L may be removed from above the top surface of the intermediate structure 300a, for example, by CMP.

FIG. 3B illustrates a vertical cross-sectional view of a further intermediate structure 300b that may be used in forming an SNSPD, according to various embodiments. The intermediate structure 300b may be formed by forming additional masking layers over the intermediate structure 300a of FIG. 3A. In this regard, the intermediate structure 300b may include a second hard mask layer 304L, a third hard mask layer 306L, and a mandrel layer 308L.

The second hard mask layer 304L and the third hard mask layer 306L may each include an etch stop material, such as silicon nitride, silicon carbide, silicon nitride carbide, or a dielectric metal oxide or nitride (such as aluminum oxide, titanium oxide, tantalum oxide, titanium nitride, etc.). The second hard mask layer 304L and the third hard mask layer 306L may be deposited by a conformal or non-conformal deposition process. In one embodiment, the second hard mask layer 304L and the third hard mask layer 306L may be deposited by CVD, PVD, or ALD. The thickness of the second hard mask layer 304L and the third hard mask layer 306L may each be in a range from approximately 2 nm to approximately 20 nm, such as from approximately 3 nm to approximately 12 nm, although smaller and larger thicknesses may also be used. In one embodiment, the second hard mask layer 304L may include silicon nitride and the third hard mask layer 306L may include titanium nitride.

The mandrel layer 308L may be formed by depositing a blanket layer of sacrificial material over the third hard mask layer 306L. The mandrel layer 308L may include, for example, a semiconductor material, such as amorphous silicon, or a carbon based material, such as spin-on carbon, amorphous fluorinated carbon or photoresist. Other dielectric materials are within the contemplated scope of disclosure. The mandrel layer 308L may be deposited by a conformal deposition process (such as a CVD process) or a self-planarizing deposition process (such as spin coating). Excess portions of the mandrel layer 308L may optionally be removed from above the top surface of the intermediate structure 300b, for example, by CMP.

FIG. 3C illustrates a vertical cross-sectional view of a further intermediate structure 300c that may be used in forming an SNSPD, according to various embodiments. The intermediate structure 300c of FIG. 3C may be formed by forming a patterned photoresist 310 over the mandrel layer 308L. In this regard, a blanket layer of photoresist material (not shown) may be deposed over the mandrel layer 308L and may be patterned using photolithographic techniques, such as immersion lithography. The patterned photoresist 310 may then be used as a mask material for etching the mandrel layer 308L. In an alternative embodiment, if the mandrel layer 308L comprises a photoresist layer, then the additional photoresist layer 310 may be omitted and the photoresist mandrel layer 308L may be patterned directly by the photolithographic techniques.

FIG. 3D illustrates a vertical cross-sectional view of a further intermediate structure 300d that may be used in forming an SNSPD, according to various embodiments. The intermediate structure 300d may be formed from the intermediate structure 300c of FIG. 3C by performing an anisotropic etch process to etch the mandrel layer 308L of the intermediate structure 300c of FIG. 3C. In this regard, an anisotropic etch that is selective to the third hard mask layer 306L may be performed to remove regions of the mandrel layer 308L that are not masked by the patterned photoresist 310. The remaining portion of the mandrel layer 308L may serve as a mandrel 308 for the SIT process mentioned above, and described in greater detail below. After etching the mandrel layer 308L has been completed, the patterned photoresist 310 shown in FIG. 3C may be removed by ashing or by dissolution with a solvent.

FIG. 3E illustrates a vertical cross-sectional view of a further intermediate structure 300e that may be used in forming an SNSPD, according to various embodiments. The intermediate structure 300e may be formed by forming a spacer layer 312L over the intermediate structure 300d of FIG. 3D. The spacer layer 312L may include, but is not limited to, insulating materials, such as silicon dioxide, silicon nitride, silicon oxynitride, hafnium oxide, hafnium silicon oxide, hafnium tantalum oxide, hafnium titanium oxide, hafnium zirconium oxide, zirconium oxide, titanium oxide, aluminum oxide, hafnium aluminum oxide, or any other suitable insulating, conductive or semiconductor material which can be formed into sidewall spacers and which permits the mandrel 308 to be selectively etched to the sidewall spacers. The spacer layer 312L may be formed as a planar blanket (i.e., un-patterned) layer by any suitable technique as ALD, CVD, PECVD, PVD, etc. In one embodiment, the spacer layer 312L may include silicon dioxide deposited using ALD.

FIG. 3F illustrates a vertical cross-sectional view of a further intermediate structure 300f that may be used in forming an SNSPD, according to various embodiments. The intermediate structure 300f may be formed by anisotropically etching the spacer layer 312L using any suitable sidewall spacer etch process. The anisotropic etch process removes all of the spacer layer 312L with the exception of a first spacer portion 312a and a second spacer portion 312b (i.e., sidewall spacers on sidewalls of the mandrel 308). As shown, the first spacer portion 312a and the second spacer portion 312b are formed on respective sidewalls of the mandrel 308. As such, the first spacer portion 312a and the second spacer portion 312b may have a thickness that is no larger than a thickness of the spacer layer 312L.

FIG. 3G illustrates a vertical cross-sectional view of a further intermediate structure 300g that may be used in forming an SNSPD, according to various embodiments. The intermediate structure 300g may be formed by performing a selective isotropic or anisotropic etch process on the intermediate structure 300f of FIG. 3F to thereby remove the mandrel 308 selective to the first and second spacer portions 312a, 312b and the third hard mask layer 306L (which is used as an etch stop). For example, if the mandrel 308 comprises amorphous silicon and the first and second spacer portions 312a, 312b comprise silicon oxide, then a selective wet etch using hot trimethyl-2 hydroxyethyl ammonium hydroxide ("hot TMY") or tetramethyl ammonium hydroxide (TMAH) may be used to selectively remove the mandrel 308. Alternatively, if the mandrel 308 comprises a carbon based material, then the mandrel 308 may be selectively removed by ashing. The first spacer portion 312a and the second spacer portion 312b that remain after the etching process may then be used as mask materials to etch the third hard mask layer 306L, as described in greater detail below.

FIG. 3H illustrates a vertical cross-sectional view of a further intermediate structure 300h that may be used in forming an SNSPD, according to various embodiments. The intermediate structure 300h may be formed by performing an anisotropic etch process on the intermediate structure 300g of FIG. 3G to thereby remove portions of the third hard mask layer 306L that are not masked by the first spacer portion 312a and the second spacer portion 312b. The first spacer portion 312a and the second spacer portion 312b may also be removed by the etching process that etches the third hard mask layer 306L. Alternatively, remaining portions of first spacer portion 312a and the second spacer portion 312b may be removed in a subsequent etching process. As shown, the etch process transforms the third hard mask layer 306L into a first mask portion 306a and second mask portion 306b. Thus, the sidewall spacers are transferred into the third hard mask layer.

In various embodiments, the first mask portion 306a and the second mask portion 306b may be used as a mask for etching various layers in the structure below. As such, the first mask portion 306a and the second mask portion 306b may be used as a mask in an etching process to form nanowires by etching the multilayer thin film stack 210, as described above with reference to the embodiment intermediate structure 200f of FIG. 2F. In contrast to the embodiment intermediate structure 200f of FIG. 2F, however, the resulting nanowires (described below) may have a width that is considerably smaller than the width of the nanowires formed in the embodiment of FIG. 2F. For example, nanowires formed in the present embodiment may have a width that is less than 50 nm, such as approximately 40 nm and a pitch (i.e., spacing between nanowires) that is less than 100 nm, such as approximately 80 nm). The first mask portion 306a and the second mask portion 306b may, in this way, be used to generate two closely spaced narrow nanowires. For simplicity of description, the embodiments described below focus only on the formation of a single straight nanowire. Similar techniques may be used in other embodiments to generate a plurality of parallel nanowires in various configurations or the serpentine nanowire 110 shown in FIG. 1A.

FIG. 3I illustrates a vertical cross-sectional view of a further intermediate structure 300i that may be used in forming an SNSPD, according to various embodiments. The intermediate structure 300i may be formed by depositing an optional organic planarization layer 314L over the intermediate structure 300h of FIG. 3I. An optional photoresist layer 316L may also be deposited over the organic planarization layer 314L. The organic planarization layer 314L may include spin-on carbon or a photo-sensitive organic polymer including a light-sensitive material that, when exposed to electromagnetic (EM) radiation, is chemically altered and thus configured to be removed using a developer. For example, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the organic planarization layer 314L may include any organic polymer and a photo-active compound having a molecular structure that may attach to the molecular structure of the organic polymer. In an example embodiment, the organic planarization layer 314L may, for example, be applied using spin coating technology. If the organic planarization layer 314L is photosensitive (i.e., functions as a photoresist), then the separate photoresist layer 316L may be omitted. Alternatively, if the photoresist layer 316L is a thin immersion lithography photoresist, then the organic planarization layer 314L is used to provide an increased planarity to the photoresist layer 316L. The photoresist layer 316L and the organic planarization layer 314L are patterned to expose the first mask portion 306a but to cover the second mask portion 306b.

FIG. 3J illustrates a vertical cross-sectional view of a further intermediate structure 300j that may be used in forming an SNSPD, according to various embodiments. The intermediate structure 300j may be formed by performing a cut etch process on the intermediate structure 300i of FIG. 3I to thereby remove the first mask portion 306a. In this regard, an etch process selective to the second hard mask layer 304L, may be used to remove the first mask portion 306a without etching the second mask portion 306b. The photoresist layer 316L and the organic planarization layer 314L may then be removed by ashing or another suitable method. The intermediate structure 300j of FIG. 3J may be used to fabricate embodiment structures having a single isolated nanowire, as described in greater detail below.

FIG. 3K illustrates a vertical cross-sectional view of a further intermediate structure 300k that may be used in forming an SNSPD, according to various embodiments. The intermediate structure 300k may be formed by depositing an additional organic planarization layer 318L over the intermediate structure 300j of FIG. 3J. An optional additional patterned photoresist may also be formed over the organic planarization layer 318L. In this regard, intermediate structure 300k may include a patterned photoresist having a first photoresist portion 320a and a second photoresist portion 320b. As described in greater detail below with reference to FIG. 4B, the first photoresist portion 320a may correspond to a region in which a nanowire and an electrical connector (both to be fabricated) may be joined. Further, the second photoresist portion 320b may correspond to a portion of the electrical connector or contact that is not in contact with the nanowire.

FIG. 3L illustrates a vertical cross-sectional view of a further intermediate structure 300l that may be used in forming an SNSPD, according to various embodiments. The intermediate structure 300l may be formed by patterning the organic planarization layer 318L using the first photoresist portion 320a and the second photoresist portion 320b. As described above, regions of organic planarization layer 318L that are not masked by the first photoresist portion 320a and the second photoresist portion 320b may then be removed by selective etching or by exposure to EM radiation followed by dissolution by a developer. As shown in FIG. 3L, the patterned organic planarization layer may include a first organic planarization layer portion 318a and a second organic planarization layer portion 318b.

FIGS. 4A, 4B, and 4C illustrate three different views of the intermediate structure 300l of FIG. 3L. In this regard, FIG. 4A is a vertical cross-sectional view taken along the section A-A' in FIG. 4B, and is a view of the intermediate structure 300l of FIG. 3L that is compressed along the horizontal direction for clarity of description. FIG. 4B is a top view of the intermediate structure 300l and FIG. 4C is a further vertical cross-sectional view taken along the section C-C' in FIG. 4B. As shown in FIG. 4B, the patterned photoresist and the patterned organic planarization layer form a two-dimensional structure that may be used as a mask for etching the multilayer thin film stack 210 to form electrical connectors and contacts for a nanowire. Similarly, the second mask portion 306b (e.g., see FIGS. 4A, 4B, and 4C) may be used as a mask when etching the multilayer thin film stack 210 to form the nanowire.

FIG. 4D illustrates a vertical cross-sectional view of a further intermediate structure 400d that may be used in forming an SNSPD, according to various embodiments. The intermediate structure 400d may be formed by etching the second hard mask layer 304L, using an etching process that is selective to the first hard mask layer 302L, to thereby remove portions of the second hard mask layer 304L that are not masked by the second mask portion 306b and/or by the patterned photoresist and the patterned organic planarization layer. As shown in FIG. 4D, the etching process generates a third mask portion 304a and a fourth mask portion 304b as remaining portions after the second hard mask layer 304L is etched. The third mask portion 304a and the fourth mask portion 304b may then be used to etch the first hard mask layer 302L, as described in greater detail with reference to FIG. 4E, below.

FIG. 4E illustrates a vertical cross-sectional view of a further intermediate structure 400e that may be used in forming an SNSPD, according to various embodiments. The intermediate structure 400e may be formed by etching the first hard mask layer 302L, using an etching process that is selective to the fourth material 236, to thereby remove portions of the first hard mask layer 302L that are not masked by the third mask portion 304a and by the fourth mask portion 304b. In this example, the second mask portion 306b, the second organic planarization layer portion 318b, and the second photoresist portion 320b may be removed from the intermediate structure 400d prior to etching the first hard mask layer 302L by selective etching and/or ashing. As shown in FIG. 4E, the etching process generates a fifth mask portion 302a and a sixth mask portion 302b as remaining portions after the first hard mask layer 303L is etched. The fifth mask portion 302a and the sixth mask portion 302b may then be used to etch the multilayer thin film stack 210 to form a nanowire and corresponding electrical connectors and contacts, as described in greater detail with reference to FIGS. 4F and 4G, below.

FIG. 4F illustrates a vertical cross-sectional view of an optional further intermediate structure 400f that may be used in forming an SNSPD. The optional intermediate structure 400f may be formed from the intermediate structure 400e by removing the third mask portion 304a and the fourth mask portion 304b. In this regard, the third mask portion 304a and the fourth mask portion 304b may be removed by performing a selective etch process that selectively removes the material of the second hard mask layer. For example, if the third and fourth mask portions 304a, 304b comprise silicon nitride, then a selective hot phosphoric acid etch may be used to selectively etch the third and fourth mask portions 304a, 304b.

FIG. 4G illustrates a vertical cross-sectional view of a superconducting nanowire formed over the waveguide 105 that forms an SNSPD 400g, according to various embodiments. The multilayer thin film stack 210 of the intermediate structure 400f of FIG. 4F may then be etched, as described above with reference to the embodiment 200f of FIG. 2F to form a nanowire 402 and an electrical connector and/or contact structure 404, as described in greater detail, below. The nanowire 402 may be similar to the nanowire 110, except that the nanowire 402 is thinner and/or smoother than the nanowire 110 and has a lower line edge roughness. For example, nanowire may have a width of less than 90 nm. The nanowire 402 extends horizontally above the waveguide 105. Furthermore, while the nanowire 402 may be serpentine similar to the nanowire 110, in other embodiments, the nanowire 402 may be a straight, linear nanowire. Furthermore, plural nanowires 402 between the adjacent connector and/or contact structures 404 may be formed using the above method. The connector and/or contact structures 404 may include the connector portions (121, 122) and/or the contact portions (123, 124) described above with respect to FIG. 1A. Thus, the step of etching the multilayer thin film stack further forms a first electrical connector portion 121 in contact with a first end of the superconducting nanowire 402 and a second electrical connector portion 122 in contact with a second end of the superconducting nanowire 402. The superconducting nanowire 402 is narrower than the first electrical connector portion 121 and the second electrical connector portion 122. In another embodiment, the structures 404 may also include one or more passive components, such as an inductor.

The multilayer thin film stack 210 of the intermediate structure 400f may be etched using an anisotropic etch process using the first material 230 as an etch stop to generate the nanowire 402 and the electrical connector and/or contact structure 404, as shown in FIG. 4G. In each of the nanowire 402 and the electrical connector and/or contact structure 404, the remaining portion of the layer of the second material 232 becomes a seed layer (132a, 132b), the remaining portion of the layer of the third material 234 becomes a superconducting layer (134a, 134b), and the remaining portion of the layer of the fourth material 236 becomes a cap layer (136a, 136b). The fifth mask portion 302a and the sixth mask portion 302b may be removed or may be included in the nanowire 402 and electrical connector and/or contact structure 404, as shown in the embodiment SNSPD 400g of FIG. 4G.

FIG. 4H illustrates a vertical cross-sectional view of the SNSPD of FIG. 4G in which an encapsulation layer 330L is formed over the structure of FIG. 4G, according to various embodiments. In one embodiment, the encapsulation layer 330L may include the same material as the first material 230 and may be deposited using similar deposition techniques. For example, the encapsulation layer 330L may include silicon nitride and may be deposited using a process suitable for depositing an ultrathin film (e.g., 10 nm-60 nm) such as, for example, CVD, PVD, PECVD, Cat-CVD, HWCVD, etc. In other embodiments, the encapsulation layer 230L may include various other materials that may be deposited using various techniques.

The SNSPD 400h of FIG. 4H may comprise a portion of a quantum computer. In one embodiment, the SNSPD 400h may operate as follows. The SNSPD 400h is cooled below the superconducting critical temperature of the superconducting material of the superconducting layer (134a, 134b). A photon passing in the waveguide 105 heats the superconducting material above the superconducting critical temperature to render layer (134a, 134b) non-superconducting, thus changing its resistivity. The change in resistivity results in the change of the SNSPD 400h from the lower resistivity to the higher resistivity state.

The foregoing descriptions are provided merely as illustrative examples and are not intended to require or imply that the steps of the various embodiments must be performed in the order presented. As may be appreciated by one of ordinary skill in the art, the order of steps in the foregoing embodiments may be performed in any order. Words such as "thereafter," "then," "next," etc., are not necessarily intended to limit the order of the steps; these words may be used to guide the reader through the description of the methods. Further, any reference to claim elements in the singular, for example, using the articles "a," "an," or "the," is not to be construed as limiting the element to the singular. Further, any step or component of any embodiment described herein may be used in any other embodiment.

The preceding description of the disclosed aspects is provided to enable persons of ordinary skill in the art to make and/or use the disclosed embodiments. Various modifications to these aspects may be readily apparent to those of ordinary skill in the art, and the generic principles defined herein may be applied to other aspects without departing from the scope of the disclosure. Thus, embodiments of the disclosure are not intended to be limited to the aspects shown herein but is to be accorded the widest scope consistent with the principles and novel features disclosed herein.

The invention claimed is:

1. A method of manufacturing a superconducting nanowire, comprising:
   forming a multilayer thin film stack comprising a superconducting layer;
   forming a mandrel over the multilayer thin film stack;
   forming an etch mask comprising a first mask portion on a first side of the mandrel and a second mask portion on a second side of the mandrel;
   removing the mandrel; and
   etching the multilayer thin film stack using the etch mask to thereby form the superconducting nanowire.

2. The method of claim 1, wherein forming the multilayer thin film stack further comprises:
   depositing a layer of SiN over a substrate;
   depositing a layer of AlN over the layer of SiN;
   depositing the superconducting layer of NbN over the layer of AlN; and
   depositing a layer of amorphous silicon over the layer of NbN.

3. The method of claim 1, further comprising depositing a first hard mask layer, a second hard mask layer, and a third hard mask layer over the multilayer thin film stack.

4. The method of claim 3, wherein the first hard mask layer comprises silicon oxide, the second hard mask layer comprises silicon nitride, and the third hard mask layer comprises titanium nitride.

5. The method of claim 3, further comprising:
   depositing a mandrel layer over the third hard mask layer; and
   etching the mandrel layer to thereby form the mandrel as an unetched portion of the mandrel layer.

6. The method of claim 3, further comprising:
   forming a photoresist layer over the third hard mask layer; and
   patterning the photoresist layer to form the mandrel.

7. The method of claim 1, wherein forming the etch mask further comprises:
   depositing a spacer layer over the mandrel; and
   anisotropically etching the spacer layer to form sidewall spacers comprising the first mask portion on the first side of the mandrel and the second mask portion on the second side of the mandrel.

8. The method of claim 7, wherein the spacer layer comprises one or more of silicon dioxide, silicon nitride, silicon oxynitride, hafnium oxide, hafnium silicon oxide, hafnium tantalum oxide, hafnium titanium oxide, hafnium zirconium oxide, zirconium oxide, titanium oxide, aluminum oxide, and hafnium aluminum oxide.

9. The method of claim 7, further comprising forming at least one hard mask layer over the multilayer thin film stack, wherein the mandrel is formed over the at least one hard mask layer.

10. The method of claim 9, wherein the step of forming the etch mask further comprises:
   etching the at least one hard mask layer using the first and second mask portions to form third and fourth mask portions;
   removing the first and second mask portions; and
   removing the third mask portion without removing the fourth mask portion.

11. The method of claim 10, wherein the step of etching the multilayer thin film stack using the etch mask comprises etching the multilayer thin film stack using the fourth mask portion as a mask.

12. The method of claim 1, wherein the superconducting nanowire comprises a portion of a superconducting nanowire single photon detector.

13. The method of claim 12, further comprising forming a waveguide over a substrate; and forming a cladding layer surrounding the waveguide, wherein the multilayer thin film stack is formed over the cladding layer.

14. The method of claim 13, wherein the step of etching the multilayer thin film stack forms plurality of nanowires each having a width of less than 90 nm.

15. The method of claim 13, wherein the step of etching the multilayer thin film stack further forms a first electrical connector portion in contact with a first end of the superconducting nanowire and a second electrical connector portion in contact with a second end of the superconducting nanowire.

16. The method of claim 15, wherein the superconducting nanowire is narrower than the first electrical connector portion and the second electrical connector portion.

17. The method of claim 15, wherein the first electrical connector portion comprises one or more passive electrical components.

18. The method of claim 17, wherein the one or more passive electrical components comprise one or more inductors.

19. The method of claim 15, further comprising forming an encapsulation layer over the superconducting nanowire, the first electrical connector portion and the second electrical connector portion.

20. The method of claim 19, wherein the encapsulating layer comprises silicon nitride.

* * * * *